(12) United States Patent
Lewis et al.

(10) Patent No.: US 9,322,869 B2
(45) Date of Patent: Apr. 26, 2016

(54) DISPLAY APPARATUS INCLUDING DUMMY DISPLAY ELEMENT FOR TFT TESTING

(71) Applicant: Pixtronix, Inc., San Diego, CA (US)

(72) Inventors: Alan Gerald Lewis, Sunnyvale, CA (US); Mark Milenko Todorovich, San Diego, CA (US); Alain Blaing Nadiguebe, La Jolla, CA (US); Nada Vukovic-Radic, San Diego, CA (US); Stephen Robert Lewis, Portland, ME (US)

(73) Assignee: Pixtronix, Inc., San Diego, CA (US)

(*) Notice: Subject to any disclaimer, the term of this patent is extended or adjusted under 35 U.S.C. 154(b) by 124 days.

(21) Appl. No.: 14/295,493

(22) Filed: Jun. 4, 2014

(65) Prior Publication Data
US 2015/0192634 A1   Jul. 9, 2015

Related U.S. Application Data

(60) Provisional application No. 61/923,323, filed on Jan. 3, 2014.

(51) Int. Cl.
*G01R 31/02* (2006.01)
*G01R 31/26* (2014.01)
*G09G 3/00* (2006.01)
*G09G 3/34* (2006.01)

(52) U.S. Cl.
CPC .......... *G01R 31/2621* (2013.01); *G09G 3/006* (2013.01); *G09G 3/3433* (2013.01); *G09G 3/3466* (2013.01); *G09G 2310/0262* (2013.01); *G09G 2310/0267* (2013.01); *G09G 2310/0275* (2013.01); *G09G 2320/029* (2013.01); *G09G 2320/045* (2013.01)

(58) Field of Classification Search
CPC .......... G01R 27/2605; G01R 31/2621; H01L 27/12; G01L 7/187
USPC ......... 324/671, 672, 600, 200, 229, 635, 644, 324/662, 699, 716, 500, 760.01–763.02; 349/149, 153, 138, 155; 345/87–100
See application file for complete search history.

(56) References Cited

U.S. PATENT DOCUMENTS

| 9,000,435 | B1 * | 4/2015 | Du et al. | ......................... 257/48 |
| 2013/0235023 | A1 * | 9/2013 | Chaji et al. | .................... 345/212 |

FOREIGN PATENT DOCUMENTS

| WO | 2006053424 A1 | 5/2006 |
| WO | 2012166939 A1 | 12/2012 |

* cited by examiner

*Primary Examiner* — Melissa Koval
*Assistant Examiner* — Trung Nguyen
(74) *Attorney, Agent, or Firm* — Edward A. Gordon; Foley & Lardner LLP

(57) ABSTRACT

This disclosure provides systems, methods and apparatus for a display apparatus including dummy display elements that can be switched between being coupled to a test bus and a drive bus. When connected to the drive bus, the circuit components, including thin-film transistors, of the dummy display element experience exposure to typical operating loads. When connected to the test bus, the display apparatus can test the operating parameters of the dummy display element circuit components.

20 Claims, 13 Drawing Sheets

DISPLAY APPARATUS INCLUDING DUMMY DISPLAY ELEMENT FOR TFT TESTING

CROSS-REFERENCE TO RELATED APPLICATIONS

This Patent Application claims priority to U.S. Provisional Patent Application No. 61/923,323, filed on Jan. 3, 2014, entitled "Display Apparatus Including Dummy Display Element For TFT Testing." The disclosure of the prior Application is considered part of and is incorporated by reference in this Patent Application.

TECHNICAL FIELD

This disclosure relates to the field of imaging displays, and in particular to systems and methods for testing pixel circuit components.

DESCRIPTION OF THE RELATED TECHNOLOGY

Electromechanical systems (EMS) devices include devices having electrical and mechanical elements, such as actuators, optical components (such as mirrors, shutters, and/or optical film layers) and electronics. EMS devices can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of deposited material layers, or that add layers to form electrical and electromechanical devices.

EMS-based display apparatus have been proposed that include display elements that modulate light by selectively moving a light blocking component into and out of an optical path through an aperture defined through a light blocking layer. Doing so selectively passes light from a backlight or reflects light from the ambient or a front light to form an image.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus. The apparatus includes an array of image forming display elements arranged across a view region of a display, a dummy display element positioned outside of the viewing region, a drive bus capable of outputting drive and control signals to the image forming display elements and to the dummy display element, a test bus capable of outputting test signals to the dummy display element pixel circuit, and a set of switches. Each of the image forming display elements has an associated image forming display element pixel circuit capable of controlling the state of its respective image forming display element. The dummy display element has a dummy display element pixel circuit that is substantially similar to each of the image forming display element pixel circuits. The dummy display element pixel circuit is capable of controlling the state of the dummy display element and of allowing the testing of a plurality of thin-film transistors (TFTs) included in the dummy display element pixel circuit. The set of switches are capable of, in a first switch configuration, connecting interconnects within the dummy display element pixel circuit between interconnects in the drive bus to expose the dummy display element pixel circuit to loads experienced by the image forming display element pixel circuits. The set of switches are also capable, in a second switch configuration, of connecting interconnects within the dummy display element pixel circuit to interconnects within the test bus to measure one or more operating parameters of a first TFT of the plurality of TFTs in the dummy display element pixel circuit. In a third switch configuration, the set of switches are capable of connecting interconnects within the dummy display element pixel circuit to interconnects within the test bus to measure one or more operating parameters of a second TFT of the plurality of TFTs in the dummy display element pixel circuit.

In some implementations, the set of switches is capable of coupling the dummy display element pixel circuit interconnects to interconnects in the test bus in a plurality of additional configurations for testing each of a remainder of the plurality of TFTs in the dummy display element pixel circuit. In some implementations, the switches are capable of turning on all TFTs in the dummy display element pixel circuit between the gate terminal of a TFT under test and the test bus. In some implementations, the switches are capable of turning on all TFTs in the dummy display element pixel circuit between the source and gate terminals of a TFT under test and the test bus.

In some implementations, the apparatus also includes comprising a TFT evaluation circuit capable of determining a threshold voltage of a TFT under test in the dummy display element pixel circuit, and the one or more measured operating parameters includes the threshold voltage. In some implementations, the apparatus also includes a TFT evaluation circuit capable of determining a gate voltage to be applied to a TFT under test sufficient to cause a configured current level through the TFT under test.

In some implementations, the apparatus includes comprising a successive approximation register coupled to a digital to analog converter. An output of the digital to analog converter is coupled to a Vgate interconnect of the test bus, and the successive approximation register and the digital to analog converter are capable of applying a set of incrementally adjusted voltages to a gate terminal of a TFT under test via the Vgate interconnect.

In some implementations, the apparatus can include a display, a processor and a memory device. The processor can be configured to communicate with the display and process image data. The memory device can be configured to communicate with the processor. In some implementations, the apparatus can also include a driver circuit and a controller. The driver circuit can be configured to send at least one signal to the display. The controller can be configured to send at least a portion of the image data to the driver circuit. In some implementations, the apparatus includes an image source module that can be configured to send the image data to the processor. The image source module can include at least one of a receiver, transceiver, and transmitter. In some implementations, the apparatus can include an input device. The input device can be configured to receive input data and to communicate the input data to the processor.

Another innovative aspect of the subject matter described in this disclosure can be implemented in an apparatus. The apparatus includes an array of image forming display elements arranged across a viewing region of a display. Each of the image forming display elements has an associated image forming display element pixel circuit capable of controlling the state of its respective image forming display element. The apparatus also includes a dummy display element positioned outside of the viewing region. The dummy display element has a dummy display element pixel circuit that is substantially similar to each of the image forming display element pixel circuits. The dummy display element pixel circuit is capable of controlling the state of the dummy display element and to allow the testing of a plurality of thin-film transistors (TFTs) included in the dummy display element pixel circuit. The apparatus further includes a drive signal communication means for outputting drive and control signals to the image forming display elements and to the dummy display element, and a test signal communication means for outputting test signals to the dummy display element pixel circuit. The apparatus further includes switching means for selectively interconnecting portions of the dummy display element pixel circuit to portions of the drive signal communications means and the test signal communications means in a plurality of configurations. In a first configuration, the switching means connects portions of the dummy display element pixel circuit to portions of the drive signal communication means to expose the dummy display element pixel circuit to loads experienced by the image forming display element pixel circuits. In a second configuration, the switching means connects portions of the dummy display element pixel circuit to portions of the test signal communication means to measure one or more operating parameters of a first TFT of the plurality of TFTs in the dummy display element pixel circuit. In a third switch configuration, the switching means connects portions of the dummy display element pixel circuit to portions of the test signal communication means to measure one or more operating parameters of a second TFT of the plurality of TFTs in the dummy display element pixel circuit.

In some implementations, the switching means is capable of connecting portions of the test signal communications means to portions of the dummy display element pixel circuit in a sufficient number of configurations to test each of a remainder of the plurality of TFTs in the dummy display element pixel circuit. In some implementations, the switching means are capable of isolating a TFT under test for testing.

In some implementations, the apparatus includes a TFT evaluation means for evaluating operational parameters of a TFT under test in the dummy display element pixel circuit. In some implementations, the TFT evaluation means is capable of determining a threshold voltage of the TFT under test. In some implementations, the TFT evaluation means is capable of determining a gate voltage to be applied to the TFT under test sufficient to cause a configured current level through the TFT under test Another innovative aspect of the subject matter described in this disclosure can be implemented in a method of testing a display. The method includes displaying a plurality of images on a display apparatus by applying a set of drive signals to a plurality of display element pixel circuits via a first signal bus. The method also includes applying, via the first signal bus, a subset of the drive signals used to display the plurality of images to a dummy display element pixel circuit that is substantially the same as the display element pixel circuits. The method further includes operating a set of switches to decouple the dummy display element pixel circuit from the first signal bus and to couple the dummy display element pixel circuit to a second signal bus in a first connection configuration. A first set of test signals is applied to portions of the dummy display element pixel circuit via the second signal bus with the first connection configuration to test an operating parameter of a first thin film transistor (TFT) of a plurality of TFTs included in the dummy display element pixel circuit. The method further includes operating the set of switches to connect portions of the dummy display element pixel circuit to the second signal bus in a second connection configuration, applying a second set of test signals to portions of the dummy display element pixel circuit via the second signal bus with the second connection configuration to test an operating parameter of a second TFT of the dummy display element pixel circuit.

In some implementations, the method includes operating the set of switches and applying additional sets of test signals to test an operational parameter of each of a remainder of TFTs in the dummy display element pixel circuit. In some implementations, testing an operating parameter of the first and second TFTs includes determining a threshold voltage of each of the respective TFTs.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCDs), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1A:
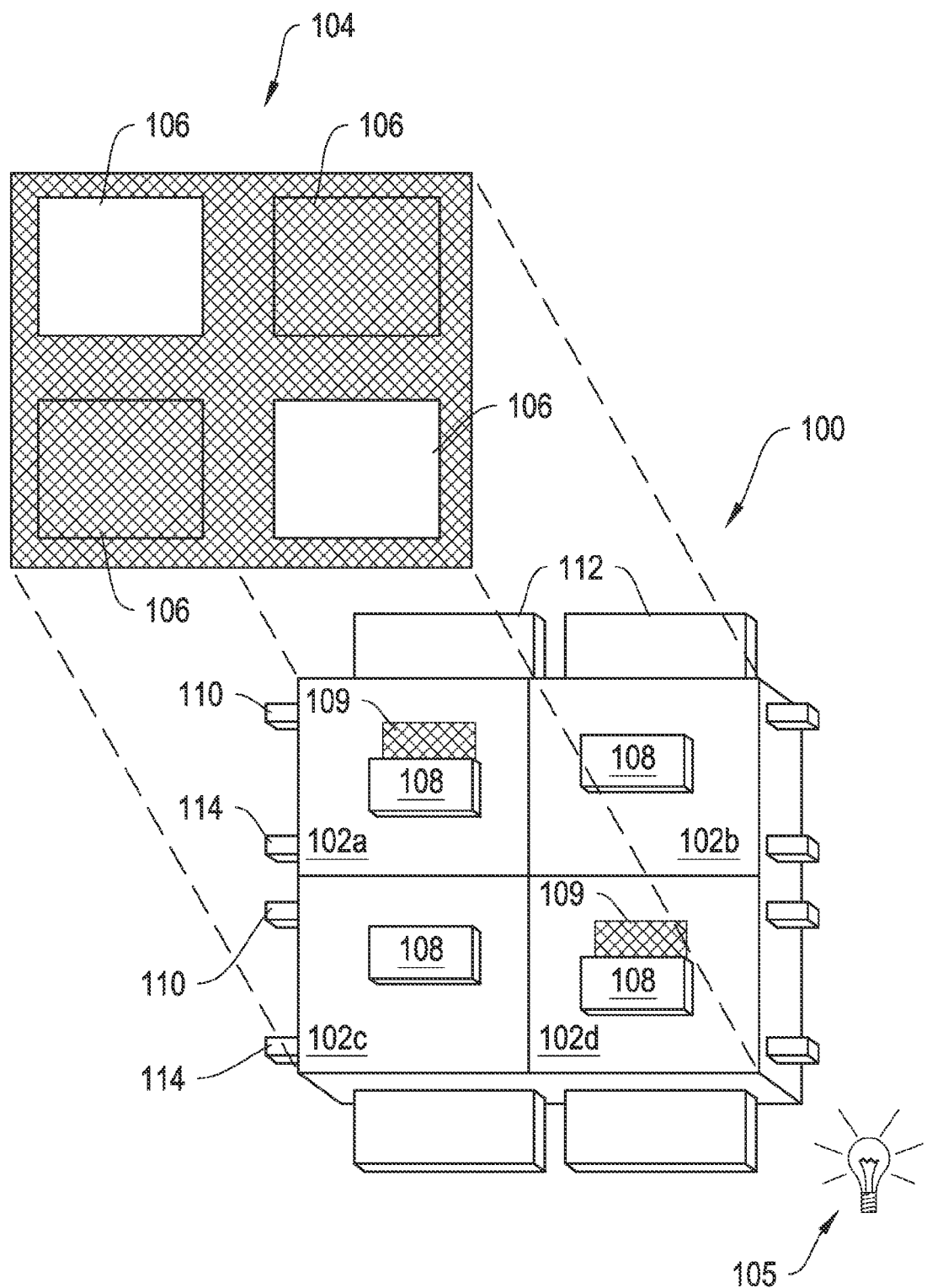
FIG. 1A shows a schematic diagram of an example direct-view microelectromechanical systems (MEMS) based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be capable of displaying an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (for example, e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

In some displays built using thin-film transistors (TFTs), the operational parameters, such as the threshold voltage and gain, of the TFTs can change over time and in different operating conditions. To accommodate such changes to maintain reliable operation over time, it is useful to be able to monitor the operating parameters of display TFTs over their lifetime. To allow for such monitoring, one or more dummy display elements can be included in a display. The dummy display elements have a pixel circuit architecture substantially similar to the pixel circuit architecture of the display elements used to form images on the display.

The display can then switch the dummy display element pixel circuit between being coupled to a drive bus and test bus. When coupled to the drive bus, the TFTs of the dummy display element pixel circuit are exposed to the same electrical signals as image forming display elements. During normal operations, the dummy display element pixel circuit is coupled to the drive bus so that its TFTs experience loads similar to that of TFTs in the other pixel circuits of the display. When coupled to the test bus, the display can test the operating parameters of the TFTs within the dummy display element pixel circuit. In some implementations, the dummy display element pixel circuit can be connected to the test bus in a variety of configurations such that each of the TFTs can be individually tested. In some implementations, the TFTs can be tested upon each start-up of the display. In some implementations, the TFTs can be tested in response to some other scheduling, timing, or test trigger scheme.

The data collected about the TFT operating parameters can then be sent to a display controller. The display controller can then use the information to adjust drive signal parameters for controlling the image forming display element pixel circuits.

FIG. 1A shows a schematic diagram of an example direct-view MEMS-based display apparatus 100. The display apparatus 100 includes a plurality of light modulators 102a-102d (generally light modulators 102) arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide a luminance level in an image 104. With respect to an image, a pixel corresponds to the smallest picture element defined by the resolution of image. With respect to structural components of the display apparatus 100, the term pixel refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the image can be seen by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or backlight so that each pixel can be uniformly illuminated. Transmissive direct-view displays are often built onto transparent or glass substrates to facilitate a sandwich assembly arrangement where one substrate, containing the light modulators, is positioned over the backlight.

Each light modulator 102 can include a shutter 108 and an aperture 109. To illuminate a pixel 106 in the image 104, the shutter 108 is positioned such that it allows light to pass through the aperture 109. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix coupled to the substrate and to the light modulators for controlling the movement of the shutters. The control matrix includes a series of electrical interconnects (such as interconnects 110, 112 and 114), including at least one write-enable interconnect 110 (also referred to as a scan line interconnect) per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the write-enabling voltage, $V_{WE}$), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, such as transistors or other non-linear circuit elements that control the application of separate actuation voltages, which are typically higher in magnitude than the data voltages, to the light modulators 102. The application of these actuation voltages results in the electrostatic driven movement of the shutters 108.

Figure 1B:
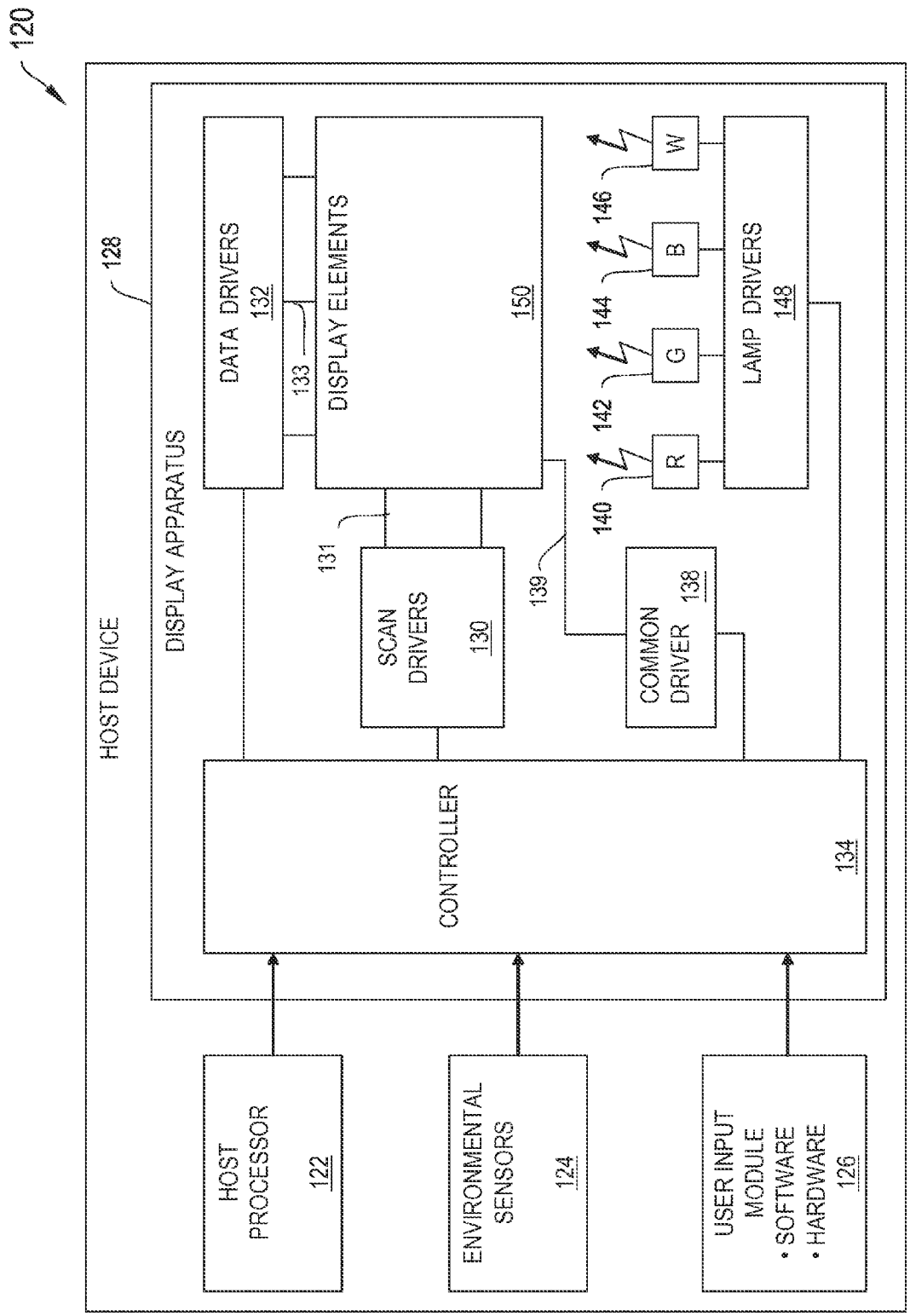
FIG. 1B shows a block diagram of an example host device.

FIG. 1B shows a block diagram of an example host device 120 (i.e., cell phone, smart phone, PDA, MP3 player, tablet, e-reader, netbook, notebook, watch, wearable device, laptop, television, or other electronic device). The host device 120 includes a display apparatus 128 (such as the display apparatus 100 shown in FIG. 1A), a host processor 122, environmental sensors 124, a user input module 126, and a power source.

The display apparatus 128 includes a plurality of scan drivers 130 (also referred to as write enabling voltage sources), a plurality of data drivers 132 (also referred to as data voltage sources), a controller 134, common drivers 138, lamps 140-146, lamp drivers 148 and an array of display elements 150, such as the light modulators 102 shown in FIG. 1A. The scan drivers 130 apply write enabling voltages to scan line interconnects 131. The data drivers 132 apply data voltages to the data interconnects 133.

In some implementations of the display apparatus, the data drivers 132 are capable of providing analog data voltages to the array of display elements 150, especially where the luminance level of the image is to be derived in analog fashion. In analog operation, the display elements are designed such that when a range of intermediate voltages is applied through the data interconnects 133, there results a range of intermediate illumination states or luminance levels in the resulting image. In some other implementations, the data drivers 132 are capable of applying only a reduced set, such as 2, 3 or 4, of digital voltage levels to the data interconnects 133. In implementations in which the display elements are shutter-based light modulators, such as the light modulators 102 shown in FIG. 1A, these voltage levels are designed to set, in digital fashion, an open state, a closed state, or other discrete state to each of the shutters 108. In some implementations, the drivers are capable of switching between analog and digital modes.

The scan drivers 130 and the data drivers 132 are connected to a digital controller circuit 134 (also referred to as the controller 134). The controller 134 sends data to the data drivers 132 in a mostly serial fashion, organized in sequences, which in some implementations may be predetermined, grouped by rows and by image frames. The data drivers 132 can include series-to-parallel data converters, level-shifting, and for some applications digital-to-analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 139. In some other implementations, the common drivers 138, following commands from the controller 134, issue voltage pulses or signals to the array of display elements 150, for instance global actuation pulses which are capable of driving and/or initiating simultaneous actuation of all display elements in multiple rows and columns of the array.

Each of the drivers (such as scan drivers 130, data drivers 132 and common drivers 138) for different display functions can be time-synchronized by the controller 134. Timing commands from the controller 134 coordinate the illumination of red, green, blue and white lamps (140, 142, 144 and 146 respectively) via lamp drivers 148, the write-enabling and sequencing of specific rows within the array of display elements 150, the output of voltages from the data drivers 132, and the output of voltages that provide for display element actuation. In some implementations, the lamps are light emitting diodes (LEDs).

The controller 134 determines the sequencing or addressing scheme by which each of the display elements can be re-set to the illumination levels appropriate to a new image 104. New images 104 can be set at periodic intervals. For instance, for video displays, color images or frames of video are refreshed at frequencies ranging from 10 to 300 Hertz (Hz). In some implementations, the setting of an image frame to the array of display elements 150 is synchronized with the illumination of the lamps 140, 142, 144 and 146 such that alternate image frames are illuminated with an alternating series of colors, such as red, green, blue and white. The image frames for each respective color are referred to as color subframes. In this method, referred to as the field sequential color method, if the color subframes are alternated at frequencies in excess of 20 Hz, the human visual system (HVS) will average the alternating frame images into the perception of an image having a broad and continuous range of colors. In some other implementations, the lamps can employ primary colors other than red, green, blue and white. In some implementations, fewer than four, or more than four lamps with primary colors can be employed in the display apparatus 128.

In some implementations, where the display apparatus 128 is designed for the digital switching of shutters, such as the shutters 108 shown in FIG. 1A, between open and closed states, the controller 134 forms an image by the method of time division gray scale. In some other implementations, the display apparatus 128 can provide gray scale through the use of multiple display elements per pixel.

In some implementations, the data for an image state is loaded by the controller 134 to the array of display elements 150 by a sequential addressing of individual rows, also referred to as scan lines. For each row or scan line in the sequence, the scan driver 130 applies a write-enable voltage to the write enable interconnect 131 for that row of the array of display elements 150, and subsequently the data driver 132 supplies data voltages, corresponding to desired shutter states, for each column in the selected row of the array. This addressing process can repeat until data has been loaded for all rows in the array of display elements 150. In some implementations, the sequence of selected rows for data loading is linear, proceeding from top to bottom in the array of display elements 150. In some other implementations, the sequence of selected rows is pseudo-randomized, in order to mitigate potential visual artifacts. And in some other implementations, the sequencing is organized by blocks, where, for a block, the data for only a certain fraction of the image is loaded to the array of display elements 150. For example, the sequence can be implemented to address only every fifth row of the array of the display elements 150 in sequence.

In some implementations, the addressing process for loading image data to the array of display elements 150 is separated in time from the process of actuating the display elements. In such an implementation, the array of display elements 150 may include data memory elements for each display element, and the control matrix may include a global actuation interconnect for carrying trigger signals, from the common driver 138, to initiate simultaneous actuation of the display elements according to data stored in the memory elements.

In some implementations, the array of display elements 150 and the control matrix that controls the display elements may be arranged in configurations other than rectangular rows and columns. For example, the display elements can be arranged in hexagonal arrays or curvilinear rows and columns.

The host processor 122 generally controls the operations of the host device 120. For example, the host processor 122 may be a general or special purpose processor for controlling a portable electronic device. With respect to the display apparatus 128, included within the host device 120, the host processor 122 outputs image data as well as additional data about the host device 120. Such information may include data from environmental sensors 124, such as ambient light or temperature; information about the host device 120, including, for example, an operating mode of the host or the amount of power remaining in the host device's power source; information about the content of the image data; information about the type of image data; and/or instructions for the display apparatus 128 for use in selecting an imaging mode.

In some implementations, the user input module 126 conveys the personal preferences of the user to the controller 134, either directly, or via the host processor 122. In some implementations, the user input module 126 is controlled by software in which a user programs personal preferences, for example, color, contrast, power, brightness and content preferences. In some other implementations, these preferences are input to the host device 120 using hardware, such as a button, switch or dial, or with touch-capability. The plurality of data inputs to the controller 134 direct the controller to provide data to the various drivers 130, 132, 138 and 148 which correspond to optimal imaging characteristics.

The environmental sensor module 124 also can be included as part of the host device 120. The environmental sensor module 124 can be capable of receiving data about the ambient environment, such as temperature and/or ambient lighting conditions. The sensor module 124 can be programmed, for example, to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2A:
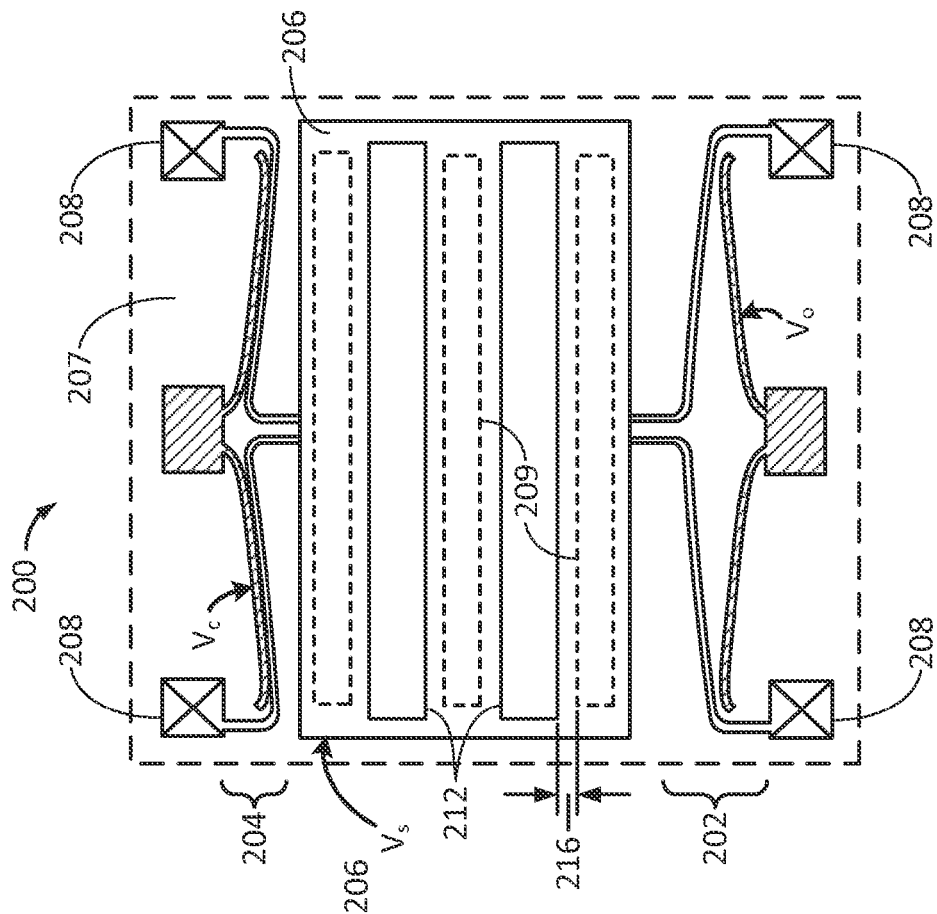
FIGS. 2A and 2B show views of an example dual actuator shutter assembly.
Figure 2B:
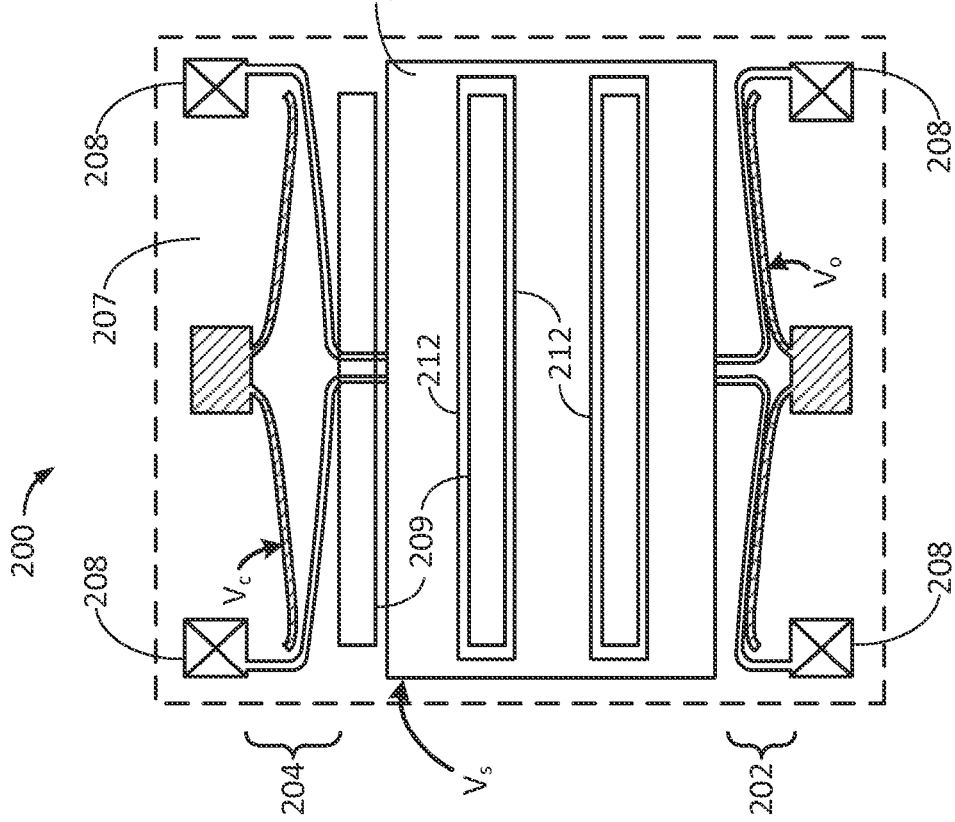

FIGS. 2A and 2B show views of an example dual actuator shutter assembly 200. The dual actuator shutter assembly 200, as depicted in FIG. 2A, is in an open state. FIG. 2B shows the dual actuator shutter assembly 200 in a closed state. The shutter assembly 200 includes actuators 202 and 204 on either side of a shutter 206. Each actuator 202 and 204 is independently controlled. A first actuator, a shutter-open actuator 202, serves to open the shutter 206. A second opposing actuator, the shutter-close actuator 204, serves to close the shutter 206. Each of the actuators 202 and 204 can be implemented as compliant beam electrode actuators. The actuators 202 and 204 open and close the shutter 206 by driving the shutter 206 substantially in a plane parallel to an aperture layer 207 over which the shutter is suspended. The shutter 206 is suspended a short distance over the aperture layer 207 by anchors 208 attached to the actuators 202 and 204. Having the actuators 202 and 204 attach to opposing ends of the shutter 206 along its axis of movement reduces out of plane motion of the shutter 206 and confines the motion substantially to a plane parallel to the substrate (not depicted).

In the depicted implementation, the shutter 206 includes two shutter apertures 212 through which light can pass. The aperture layer 207 includes a set of three apertures 209. In FIG. 2A, the shutter assembly 200 is in the open state and, as such, the shutter-open actuator 202 has been actuated, the shutter-close actuator 204 is in its relaxed position, and the centerlines of the shutter apertures 212 coincide with the centerlines of two of the aperture layer apertures 209. In FIG. 2B, the shutter assembly 200 has been moved to the closed state and, as such, the shutter-open actuator 202 is in its relaxed position, the shutter-close actuator 204 has been actuated, and the light blocking portions of the shutter 206 are now in position to block transmission of light through the apertures 209 (depicted as dotted lines).

Each aperture has at least one edge around its periphery. For example, the rectangular apertures 209 have four edges. In some implementations, in which circular, elliptical, oval, or other curved apertures are formed in the aperture layer 207, each aperture may have only a single edge. In some other implementations, the apertures need not be separated or disjointed in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through the apertures 212 and 209 in the open state, the width or size of the shutter apertures 212 can be designed to be larger than a corresponding width or size of apertures 209 in the aperture layer 207. In order to effectively block light from escaping in the closed state, the light blocking portions of the shutter 206 can be designed to overlap the edges of the apertures 209. FIG. 2B shows an overlap 216, which in some implementations can be predefined, between the edge of light blocking portions in the shutter 206 and one edge of the aperture 209 formed in the aperture layer 207.

The electrostatic actuators 202 and 204 are designed so that their voltage-displacement behavior provides a bi-stable characteristic to the shutter assembly 200. For each of the shutter-open and shutter-close actuators, there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage $V_m$.

Generally, electrical bi-stability in electrostatic actuators, such as actuators 202 and 204, arises from the fact that the electrostatic force across an actuator is a strong function of position as well as voltage. The beams of the actuators in the light modulator 200 can be implemented to act as capacitor plates. The force between capacitor plates is proportional to $1/d^2$ where d is the local separation distance between capacitor plates. When the actuator is in a closed state, the local separation between the actuator beams is very small. Thus, the application of a small voltage can result in a relatively strong force between the actuator beams of the actuator in the closed state. As a result, a relatively small voltage, such as Vm, can keep the actuator in the closed state, even if other elements exert an opposing force on the actuator.

In dual-actuator light modulators, such as 200 the equilibrium position of the light modulator will be determined by the combined effect of the voltage differences across each of the actuators. In other words, the electrical potentials of the three terminals, namely, the shutter open drive beam, the shutter close drive beam, and the load beams, as well as modulator position, are considered to determine the equilibrium forces on the modulator.

For an electrically bi-stable system, a set of logic rules can describe the stable states and can be used to develop reliable addressing or digital control schemes for a given light modulator. Referring to the shutter-based light modulator 200 as an example, these logic rules are as follows:

Let Vs be the electrical potential on the shutter or load beam. Let Vo be the electrical potential on the shutter-open drive beam. Let Vc be the electrical potential on the shutter-close drive beam. Let the expression |Vo−Vs| refer to the absolute value of the voltage difference between the shutter and the shutter-open drive beam. Let Vm be the maintenance voltage. Let Vact be the actuation threshold voltage, i.e., the voltage to actuate an actuator absent the application of Vm to an opposing drive beam. Let Vmax be the maximum allowable potential for Vo and Vc. Let Vm<Vact<Vmax. Then, assuming Vo and Vc remain below Vmax:

If |Vo−Vs|<Vm and |Vc−Vs|<Vm    (rule 1)

Then the shutter will relax to the equilibrium position of its mechanical spring.

If |Vo−Vs|>Vm and |Vc−Vs|>Vm    (rule 2)

Then the shutter will not move, i.e., it will hold in either the open or the closed state, whichever position was established by the last actuation event.

If |Vo−Vs|>Vact and |Vc−Vs|<Vm    (rule 3)

Then the shutter will move into the open position.

If |Vo−Vs|<Vm and |Vc−Vs|>Vact    (rule 4)

Then the shutter will move into the closed position.

Following rule 1, with voltage differences on each actuator near zero, the shutter will relax. In many shutter assemblies, the mechanically relaxed position is only partially open or closed, and so this voltage condition is usually avoided in an addressing scheme.

The condition of rule 2 makes it possible to include a global actuation function into an addressing scheme. By maintaining a shutter voltage which provides beam voltage differences that are at least the maintenance voltage, Vm, the absolute values of the shutter open and shutter closed potentials can be altered or switched in the midst of an addressing sequence over wide voltage ranges (even where voltage differences exceed Vact) with no danger of unintentional shutter motion.

The conditions of rules 3 and 4 are those that are generally targeted during the addressing sequence to ensure the bi-stable actuation of the shutter.

The maintenance voltage difference, Vm, can be designed or expressed as a certain fraction of the actuation threshold voltage, Vact. For systems designed for a useful degree of bi-stability, the maintenance voltage can exist in a range between about 20% and about 80% of Vact. This helps ensure that charge leakage or parasitic voltage fluctuations in the system do not result in a deviation of a set holding voltage out of its maintenance range—a deviation which could result in the unintentional actuation of a shutter. In some systems an exceptional degree of bi-stability or hysteresis can be provided, with Vm existing over a range of about 2% and about 98% of Vact. In these systems, however, care must be taken to ensure that an electrode voltage condition of |Vc−Vs| or |Vo−Vs| being less than Vm can be reliably obtained within the addressing and actuation time available.

In some implementations, the first and second actuators of each light modulator are coupled to a latch or a drive circuit to ensure that the first and second states of the light modulator are the only two stable states that the light modulator can assume.

Figure 3:
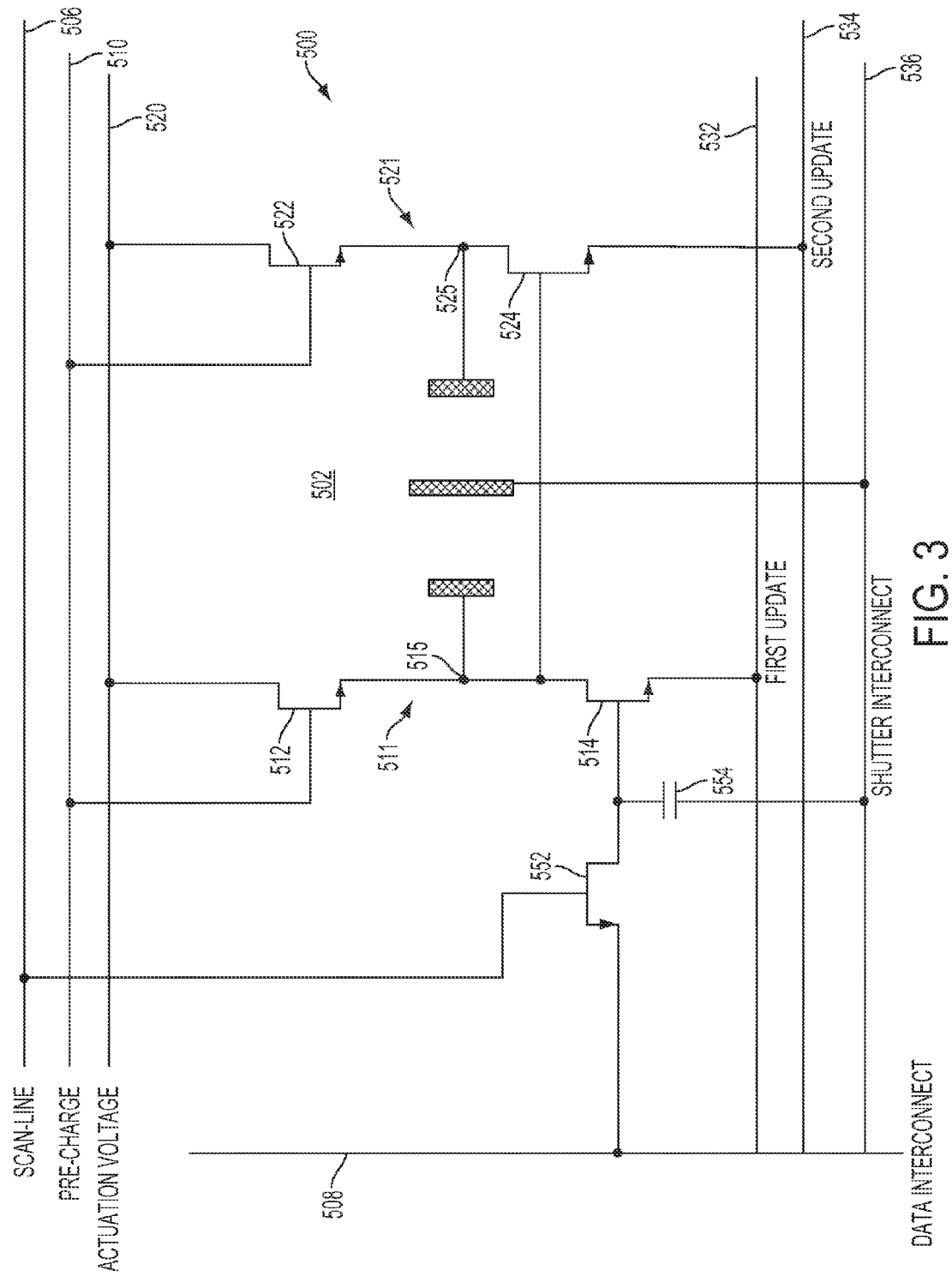
FIG. 3 shows a portion of an example pixel circuit.

FIG. 3 shows a portion of an example pixel circuit 500. The pixel circuit 500 can be implemented for use in the display apparatus 100 depicted in FIG. 1 to control a display element in an array of display elements, such as the shutter assembly 200 shown in FIGS. 2A and 2B. The structure of the pixel circuit 500 is described immediately below. Its operation will be described thereafter with respect to FIGS. 4 and 5.

The pixel circuit 500 includes a scan-line interconnect 506, which couples to the pixel circuits of each display element in a row of display elements in the display apparatus 100 and a data interconnect 508 which couples to the pixel circuits of each display element in a column of display elements. The scan-line interconnect 506 is configured to allow data to be loaded into the pixel circuits. The data interconnect 508 is configured to provide a data voltage corresponding to the data to be loaded into the pixel circuit. Further, the pixel circuit 500 includes a pre-charge interconnect 510, an actuation voltage interconnect 520, a first update interconnect 532, a second update interconnect 534 and a shutter interconnect 536 (collectively referred to as "common interconnects"). These common interconnects 510, 520, 532, 534 and 536 are shared among pixel circuits in multiple rows and multiple columns in the array. In some implementations, the common interconnects 510, 520, 532, 534 and 536 are shared among all pixel circuits in the display apparatus 100.

The pixel circuit 500 also includes a write-enable transistor 552 and a data store capacitor 554. The gate of the write-enable transistor 552 is coupled to the scan-line interconnect 506 such that the scan-line interconnect 506 controls the write-enable transistor 552. The source of the write-enable transistor 552 is coupled to the data interconnect 508 and the drain of the write-enable transistor 552 is coupled to a first terminal of the data store capacitor 554 and a first state inverter 511 described below. A second terminal of the data store capacitor 554 is coupled to the shutter interconnect 536. In this way, as the write-enable transistor 552 is switched on via a write-enabling voltage provided by the scan-line interconnect 506, a data voltage provided by the data interconnect 508 passes through the write-enable transistor 552 and is stored at the data store capacitor 554. The stored data voltage is then used to drive the display element to one of a first state or second state.

The pixel circuit 500 also includes a dual-actuation light modulator 504 that can be driven between a first state and a second state. The light modulator 504 is driven to the first state by a first actuator coupled to a first actuation node 515, while the light modulator 504 can be driven to the second state by a second actuator coupled to a second actuation node 525. The pixel circuit 500 includes a first state inverter 511 and a second state inverter 521. The first state inverter 511 governs the voltage at the first actuation node 515 and includes a first charge transistor 512 coupled to a first discharge transistor 514 at the first actuation node 515. The second state inverter 521 governs the voltage at the second actuation node 525 and includes a second charge transistor 522 coupled to a second discharge transistor 524 at the second actuation node 525.

The gate of the first charge transistor 512 is connected to the pre-charge interconnect 510, while the drain of the first charge transistor 512 is connected to the actuation voltage interconnect 520. The source of the first charge transistor 512 is coupled to the drain of the of the first discharge transistor 514 at the first actuation node 515. The gate of the first discharge transistor 514 is connected to the drain of the write-enable transistor 552 and one end of the data store capacitor 554. The source of the first discharge transistor is coupled to the first update interconnect 532.

The gate of the second charge transistor 522 is also connected to the pre-charge interconnect 510. The drain of the second charge transistor 522 is connected to the actuation voltage interconnect 520. The source of the second charge transistor 522 is coupled to the drain of the second discharge transistor 524 at the second actuation node 525. The gate of the second discharge transistor 524 is coupled to the first actuation node 515. The source of the second discharge transistor 524 is coupled to the second update interconnect 534.

The first update interconnect 532, along with the voltage stored on the data store capacitor 554, controls the voltage at the first actuation node 515 via the first discharge transistor 514. The second update interconnect 534 controls the voltage at the second actuation node 525 via the second discharge transistor 524. Each of the transistors 512, 514, 522, 524 and 552 are n-type thin film [or MOS] transistors. As described above, circuits formed from only one-type of transistors are particularly useful in more recent Indium Gallium Zinc Oxide (IGZO) (as well as other metal oxide) manufacturing processes, especially where p-type transistors are difficult to build. Alternatively, a pixel circuit could be designed with all p-type transistors.

Figure 4:
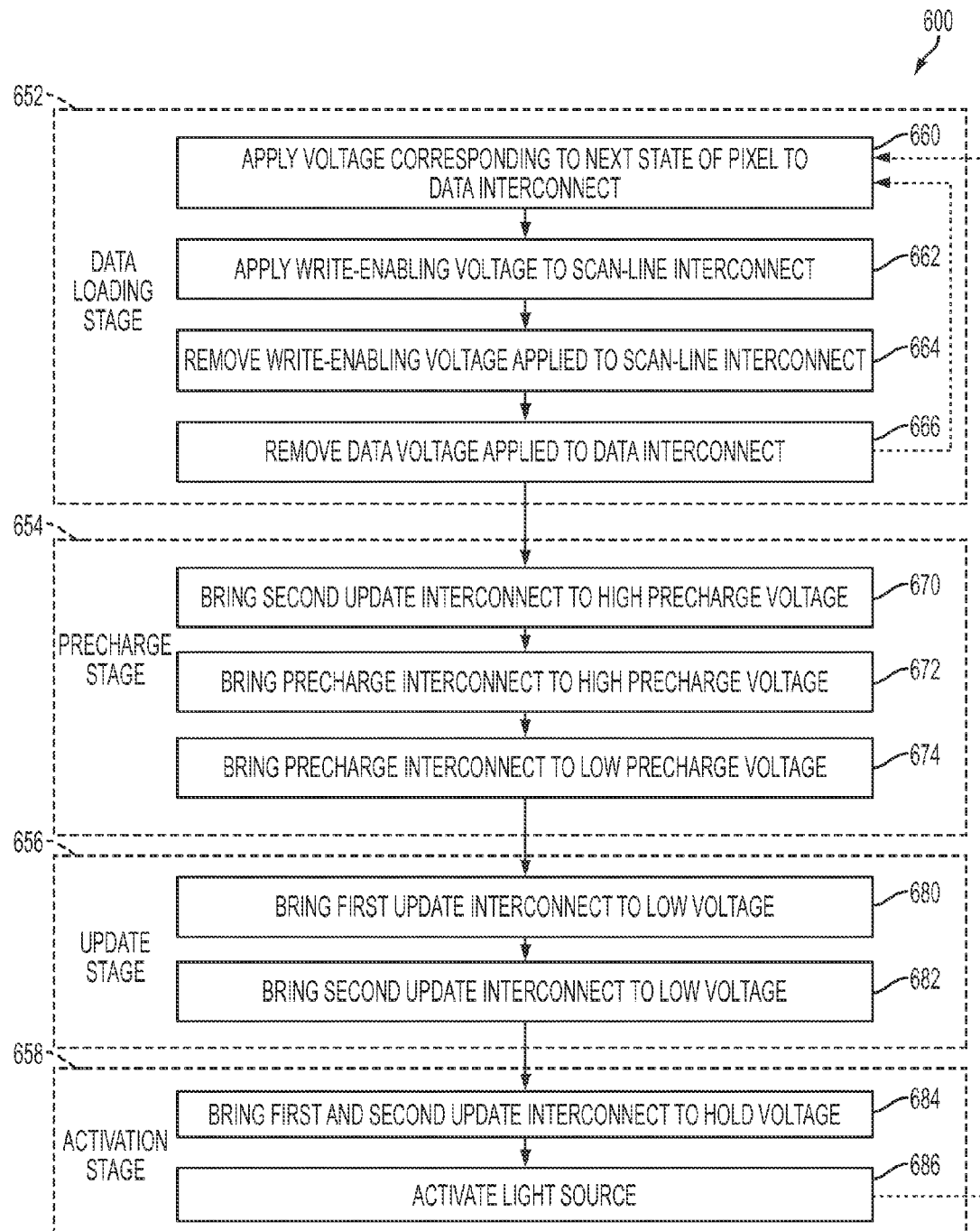
FIG. 4 shows a flow diagram of an example frame addressing and display element actuation method.

FIG. 4 shows a flow diagram of an example frame addressing and display element actuation method 600. The method 600 may be employed, for example, to operate the pixel circuit 500 of FIG. 4. The frame addressing and display element actuation method 600 proceeds in four general stages. First, data voltages for display elements in a display are loaded for each display element, one row at a time, in a data loading stage (stage 652). Next, in a precharge stage, the actuation nodes coupled to the display element are charged (stage 654). Next, in an update stage, the voltages pre-loaded on the first update interconnect and the second update interconnect are modified causing the display element to assume an updated state (stage 656). Upon the display element assuming an updated state, the light source is activated in a light activation stage (stage 658).

Figure 5:
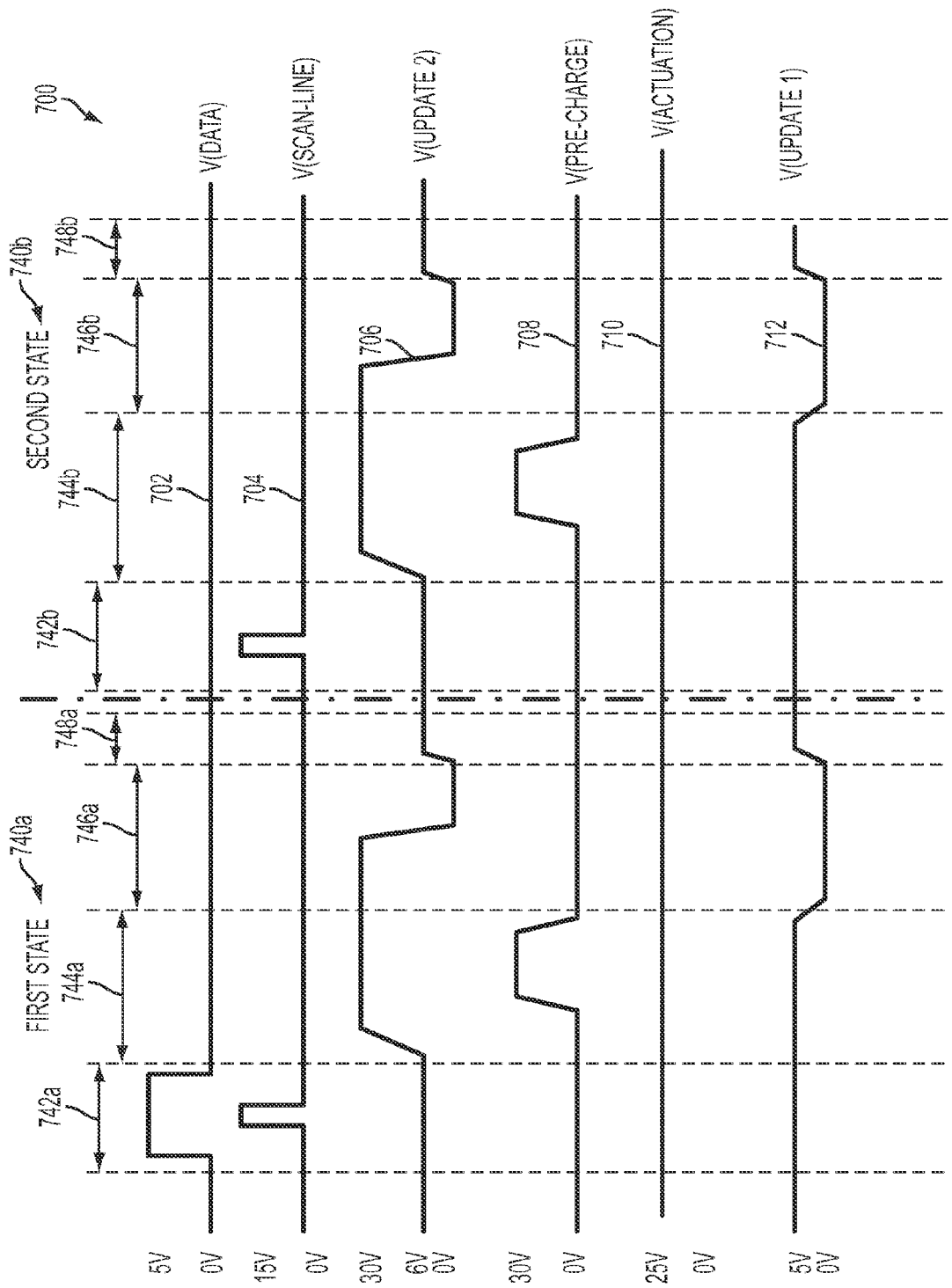
FIG. 5 shows a timing diagram of example voltages applied to various interconnects of a pixel circuit.

Details of the various stages of the frame addressing and display element actuation method 600 will be described with reference to a timing diagram depicted in FIG. 5. FIG. 5 shows a timing diagram 700 of example voltages applied to various interconnects of a pixel circuit. The timing diagram 700 may be employed, for example, to operate the pixel circuit 500 of FIG. 3 according to the frame addressing and display element actuation method 600 depicted in FIG. 4.

In particular, the timing diagram 700 includes separate timing graphs indicating the voltages at various interconnects during the various stages of the frame addressing and display element actuation method 600 employed by the pixel circuit 500. The timing diagram 700 includes a timing graph 702 indicating the voltage applied at the data interconnect 508, a timing graph 704 indicating the voltage at the scan-line interconnect 506, a timing graph 706 indicating the voltage at the second global update interconnect 534, a timing graph 708 indicating the voltage applied to the pre-charge interconnect 510, a timing graph 710 indicating the voltage applied to the actuation voltage and a timing graph 712 indicating the voltage applied to the first global update interconnect 532.

Further, the timing diagram 700 is separated into a first region 740a corresponding to a first state and a second region 740b corresponding to a second state. Both the first and second regions 740a and 740b include portions corresponding to the various stages of the frame addressing and display element actuation method 600 shown in FIG. 4. Each of the first and second regions 740a and 740b include corresponding data load portions 742a and 742b that correspond to the data loading stage 652, precharging portions 744a and 744b that correspond to the precharging stage 654, update portions 746a and 746b that correspond to the update stage 656 and activation portions 748a and 748b that correspond to the light activation stage 658. It should be appreciated that the timing diagram is not drawn to scale and that the relative lengths and widths of each of the timing graphs are not intended to indicate particular voltages or durations of time. Furthermore, the voltage levels shown in FIG. 5 are for illustrative purpose only. One of skill in the art should understand that other voltage levels can be used in different implementations.

Referring now to the frame addressing and display element actuation method 600 depicted in FIG. 4 with references being made to the pixel circuit 500 depicted in FIG. 3 and the timing diagram 700 depicted in FIG. 5, the data loading stage (stage 652) corresponds to the data loading portions 742a and 742b of the timing diagram 700. The frame addressing and display element actuation method 600 begins with the data loading stage (stage 652) for addressing each of the display elements of a particular row of the array. The data loading stage (stage 652) proceeds with applying a data voltage corresponding to a next state of the display element (stage 660). The next state may be a first state corresponding to a light transmissive state or a second state corresponding to a light blocking state. In some implementations, a data voltage that is high corresponds to a first state. This is depicted in the portion 742a of the timing graph 702. In some implementations, a data voltage that is low corresponds to a second state. This is depicted in the portion 742b of the timing graph 702.

The data loading stage (stage 652) then proceeds with applying a write-enabling voltage $V_{we}$ to the scan-line interconnect 506 corresponding to the row (stage 662) such that the scan-line interconnect 506 is write-enabled. The application of a write-enabling voltage $V_{we}$ to the scan-line interconnect 506 for the write-enabled row turns ON the write-enable transistors, such as write-enable transistor 552, of all display elements in the row.

Upon applying the write-enabling voltage to the scan-line interconnect 506 (stage 662), the data voltage $V_d$ applied to the data interconnect 508 is caused to be stored as a charge on the data store capacitor 554 of the selected display element. That is, because the write-enable transistor 552 is switched ON when the data voltage $V_d$ is applied to the data interconnect 508, the data voltage $V_d$ passes through the write-enable transistor 552 to the data store capacitor 554 on which it is loaded or stored as a charge.

The process of loading data can be performed simultaneously in each of the display elements in the row that is write-enabled. In this way, the pixel circuit 500 selectively applies the data voltage to columns of a given row in the pixel circuit 500 at the same time while that row has been write-enabled. In some implementations, the pixel circuit 500 only applies the data voltage to those columns that are to be actuated towards one of the first and second states. Once all the display elements in the row are addressed, the write-enabling voltage applied to the scan-line interconnect 506 is removed (stage 664). In some implementations, the scan-line interconnect 506 is grounded. This is depicted in the portion 742*a* of the timing graph 704. The data voltage applied to the data interconnect 508 is then also removed from the data voltage interconnect 508 (stage 666). This is depicted in the portion 742*a* of the timing graph 702 if the data voltage applied to the data interconnect 508 is high and conversely, depicted in the portion 742*b* of the timing graph 702 if the data voltage applied to the data interconnect 508 is low. The data loading stage (stage 652) is then repeated for subsequent rows of the array in the pixel circuit 500. At the end of the data loading stage (stage 652), each of the data store capacitors in the selected group of display elements contains the data voltage which is appropriate for the setting of the next image state.

The pixel circuit 500 then proceeds with the precharge stage (stage 654) where the second update interconnect 534 is brought to a high precharge voltage (stage 670). This is depicted in portions 744*a* and 744*b* of the timing graph 706. In some implementations, the precharge voltage ranges from about 12V-40V. In some implementations, the high precharge voltage may correspond to an actuation voltage applied to the actuation voltage interconnect 520. In some implementations, the second update interconnect 534 is brought to the high precharge voltage such that the second discharge transistor 524 remains switched OFF. In some implementations, the second update interconnect 534 may be brought to any voltage that is sufficient to keep the second discharge transistor 524 switched OFF while the first and second actuation nodes 515 and 525 are precharged.

Upon bringing the second update interconnect 534 to the high precharge voltage, the precharge interconnect 510 is brought to a high precharge voltage (stage 672). In some implementations, the precharge voltage ranges from about 12V-40V. In some implementations, the precharge interconnect 510 is brought to precharge voltage that corresponds to the high actuation voltage applied to the second update interconnect 534. Generally, a precharge voltage capable of switching on the first charge transistor 512 and the second charge transistor 522 is sufficient. This is depicted in portions 744*a* and 744*b* of the timing graph 708.

Upon bringing the precharge interconnect 510 to the high precharge voltage, the actuation voltage applied to the actuation voltage interconnect 520 causes the first actuation node 515 and the second actuation node 525 to be brought to the actuation voltage. In this way, the first actuation node 515 and the second actuation node 525 are said to be 'precharged'. In some implementations, the actuation voltage interconnect 520 is maintained at a voltage that corresponds to the high precharge voltage applied to the precharge interconnect 510. In some implementations, the maximum actuation voltage may be smaller than the maximum precharge voltage to account for the diode drop of the charge transistors 512 and 522. In some implementations, the actuation voltage interconnect 520 is maintained at about 25V-40V.

Upon precharging the first actuation node 515 and the second actuation node 525, the precharge interconnect 510 is also brought to a low voltage (stage 674). In some implementations, the precharge interconnect 510 voltage is brought to ground. In some implementations, the precharge interconnect 510 remains at a high voltage for approximately 10-30 μs. In some implementations, the precharge interconnect 510 remains at a high voltage for a period longer than 30 μs. This is depicted in portions 744*a* and 744*b* of the timing graph 708.

Upon precharging the first actuation node 515 and the second actuation node 525, the pixel circuit 500 proceeds with the update stage (stage 656). In this stage, the first update interconnect 532 is brought to a low voltage (stage 680). In some implementations, the first update interconnect 532 is connected to ground. The change in the voltage applied to the first update interconnect 532 is depicted in the portions 746*a* and 746*b* of the timing graph 712. If the data voltage stored on the data store capacitor 554 is high, corresponding to the first state, the first discharge transistor 514 is switched ON upon bringing the first update interconnect 532 to a low voltage state. As a result, the voltage at the first actuation node 515 is brought to a low voltage. Conversely, if the data voltage stored on the data store capacitor 554 is low corresponding to the second state, the first discharge transistor 514 remains switched OFF upon bringing the first update interconnect 532 to the low voltage. As a result, the voltage at the first actuation node 515 remains in a high voltage state.

After the first update interconnect 532 is brought to a low voltage (stage 680), the second update interconnect 534 is brought to a low voltage (stage 682). The change in the voltage applied to the second update interconnect 534 is depicted in the portions 746*a* and 746*b* of the timing graph 706. In some implementations, the second update interconnect 534 is connected to ground. In some implementations, the second update interconnect 534 is held at a high voltage long enough for the first actuation node 515 to settle in response to lowering the first update interconnect 532. In some implementations, the low voltage state may correspond to a voltage that is sufficient to switch the second discharge transistor 524 from an OFF state to an ON state, provided the first actuation node 515 is at a high voltage state. If the first actuation node 515 is brought to a low voltage corresponding to the first state, the second discharge transistor 524 remains switched OFF upon bringing the second update interconnect 534 to a low voltage. As a result, the voltage at the second actuation node 525 remains at a high voltage. Conversely, if the first actuation node 515 remains at a high voltage state corresponding to the second state, the second discharge transistor 524 is switched ON upon bringing the second update interconnect 534 to the low voltage state. As a result, the voltage at the second actuation node 525 is brought to a low voltage state. In this way, the voltage at the first actuation node 515 and the voltage at the second actuation node 525 are complementary. This is because the pixel circuit 500 is symmetric. That is, the input of the first state inverter and the input of the second state inverter are configured to receive complementary data inputs.

Based on the relative voltage states at the first actuation node 515 and the second actuation node 525, the display element 504 assumes either a first state or a second state. In some implementations, the display element 504 can assume the first state when the first actuation node 515 is at a low voltage state, while the second actuation node 525 is at a high voltage state. Conversely, the display element 504 can assume the second state when the first actuation node 515 is at a high voltage state, while the second actuation node 525 is at a low voltage state. In some implementations, the display element 504 may include a shutter. In such implementations, during the update stage 656, the shutter can either remain in a previous state or be actuated to assume a new state.

Once the actuator of the display element 504 is stable in its desired state, the pixel circuit 500 proceeds with the light activation stage 658. The light activation stage proceeds with bringing the first update interconnect 532 and the second update interconnect 534 to a hold voltage (stage 684). The hold voltage is typically equal to the voltage being applied to the gate terminal of the first discharge transistor 514 and the second discharge transistor 524. In this way, the first discharge transistor 514 and the second discharge transistor 524 can be switched OFF as the pixel circuit 500 prepares for the data loading stage corresponding to the next state. In some implementations, the second update interconnect 534 is brought to the holding voltage state after the display element 504 has settled in the state corresponding to the data voltage.

Upon bringing the first update interconnect 532 and the second update interconnect 534 to a holding voltage state, the pixel circuit 500 proceeds with activating one or more light sources (stage 686). The light activation portions 748a and 748b of the timing diagram 700 correspond to the light activation stage (stage 658). During the light activation stage, all of the voltages applied to the various interconnects may be held, as depicted in the portions 748a and 748b of the timing diagram 700. Upon activating the light source (stage 686), the frame addressing and display element actuation method 600 can be repeated by returning to the data loading stage (stage 652).

Figure 6:
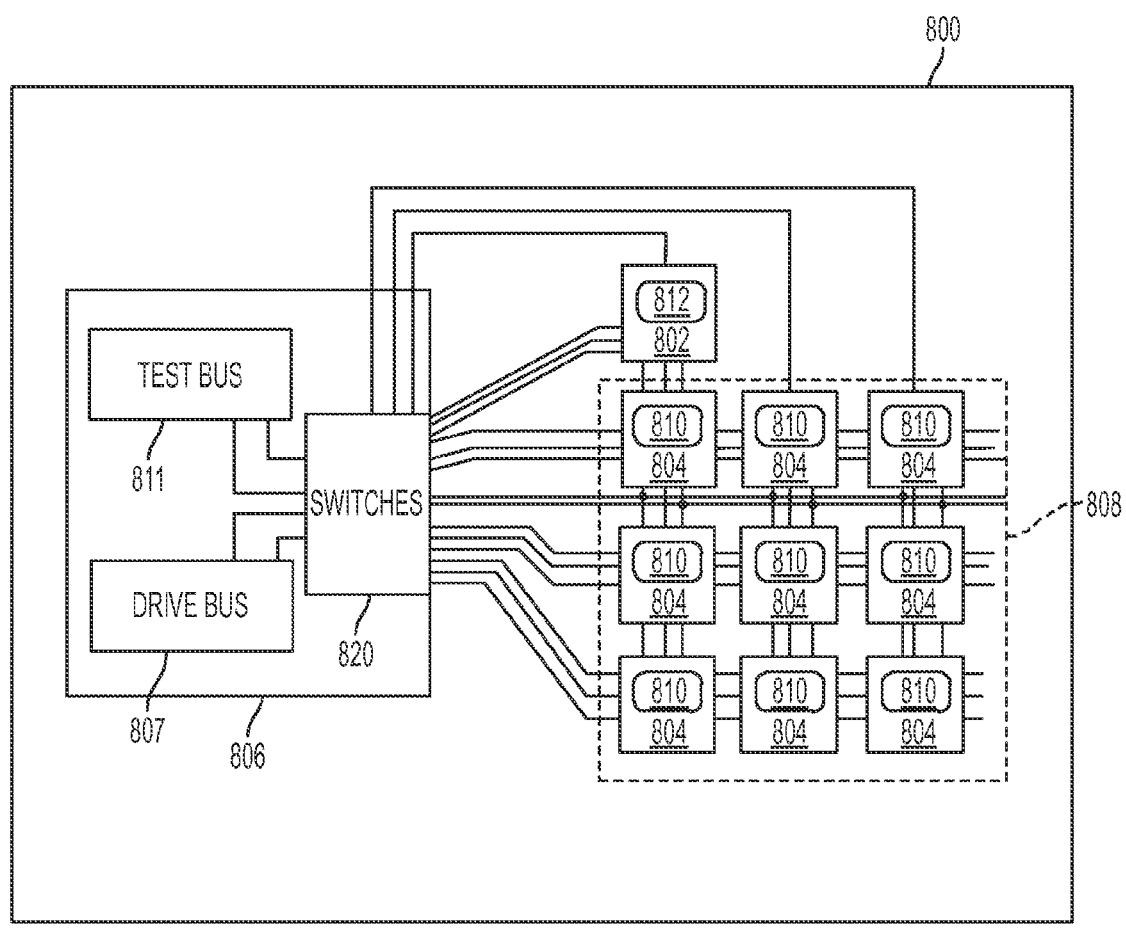
FIG. 6 shows a block diagram of portions of a display apparatus including a dummy display element.

FIG. 6 shows a block diagram of portions of a display apparatus 800 including a dummy display element 802. The display apparatus includes an array of display elements 804, including the dummy display element 802 and a driver chip 806. The driver chip 806 is coupled to each of the display elements 804, including the dummy display element 802, via a control matrix formed from a plurality of interconnects, including interconnects that couple to all display elements in a given row of the display apparatus 800, interconnects that couple to all display elements in a given column of the display apparatus 800, and common interconnects that couple to display elements in multiple rows and multiple columns of the display apparatus 800.

As indicated above, the display apparatus 800 includes an array of display elements 804, including the dummy display element 802. The display elements 804 (other than the dummy display element 802) are arranged in rows and columns forming a viewing area 808 of the display apparatus 800, via which images are formed for presentation to a viewer. The dummy display element 802 is positioned outside of this viewing area 808, e.g., just before the first row or the first column of display elements 804 in the viewing area or after the last row or last column of display elements 804. The dummy display element 802 can be positioned at other locations in different implementations.

In some implementations, the display elements 804 take the form of the shutter assemblies 200 shown in FIGS. 2A and 2B. The dummy display element 802 differs from the display elements 804 in the viewing area 808 of the display apparatus 800 in that, regardless of its state, the dummy display element 802 remains dark. It is either prevented from modulating light, or any light that it modulates is blocked from reaching a viewer. For example, in some implementations, the dummy display element 802 is formed over a portion of a light blocking layer that lacks any apertures under the dummy display element 802 to let light pass through. Alternatively, or in addition, a portion of a light blocking layer lacking apertures can be positioned on the opposite side of the dummy display element 802 blocking substantially all light passing by or through the dummy display element 802 from exiting the display.

The states of the display elements 804, other than the dummy display element 802, (i.e. the viewable display elements) are controlled by respective pixel circuits 810. In some implementations, the viewable display element pixel circuits 810 take the form of the pixel circuit 810 shown in FIG. 5. The state of the dummy display element 802 is controlled by a dummy pixel circuit 812. The dummy pixel circuit 812 is substantially similar to the viewable display element pixel circuit 810 with minor differences to allow testing of each of the TFTs included in the dummy pixel circuit 812. The details of the dummy pixel circuit 812 will be discussed further below in relation to FIG. 7. The viewable display element pixel circuits 810 and the dummy pixel circuit 812 form part of the control matrix of the display apparatus 800.

The driver chip 806 is configured both to provide control and drive signals to the display elements 804 as well as to test the operating parameters of the TFTs included in the dummy test display element 802. To that end, the driver chip 806 includes two internal buses, a drive bus 807 and a test bus 811. The drive bus outputs control and drive signals to the row interconnects, column interconnects, and common interconnects coupled to the viewable display element pixel circuits 810 of the display apparatus, e.g., as described in relation to FIGS. 5-7 above as well as to the dummy display element pixel circuit 812. The test bus 810 is configured to carry test signals to the dummy display element pixel circuit 812. Measurement circuitry (described further below) in the driver chip 806 measures and records the results of testing and can forward the results back to a controller chip, such as the controller 134 shown in FIG. 31B.

The driver chip 806 also includes a set of switches 820. The set of switches 820 selectively connects interconnects leading to the dummy display element 802 from being coupled to the drive bus 807 to being connected to one of the interconnects of the test bus 811, and visa versa. As described further below, the switches 820 are configured to be able to switch the dummy display element interconnects to couple to various combinations of test bus 811 interconnects such that each of the TFTs in the dummy display element pixel circuit 812 can be tested.

Figure 7:
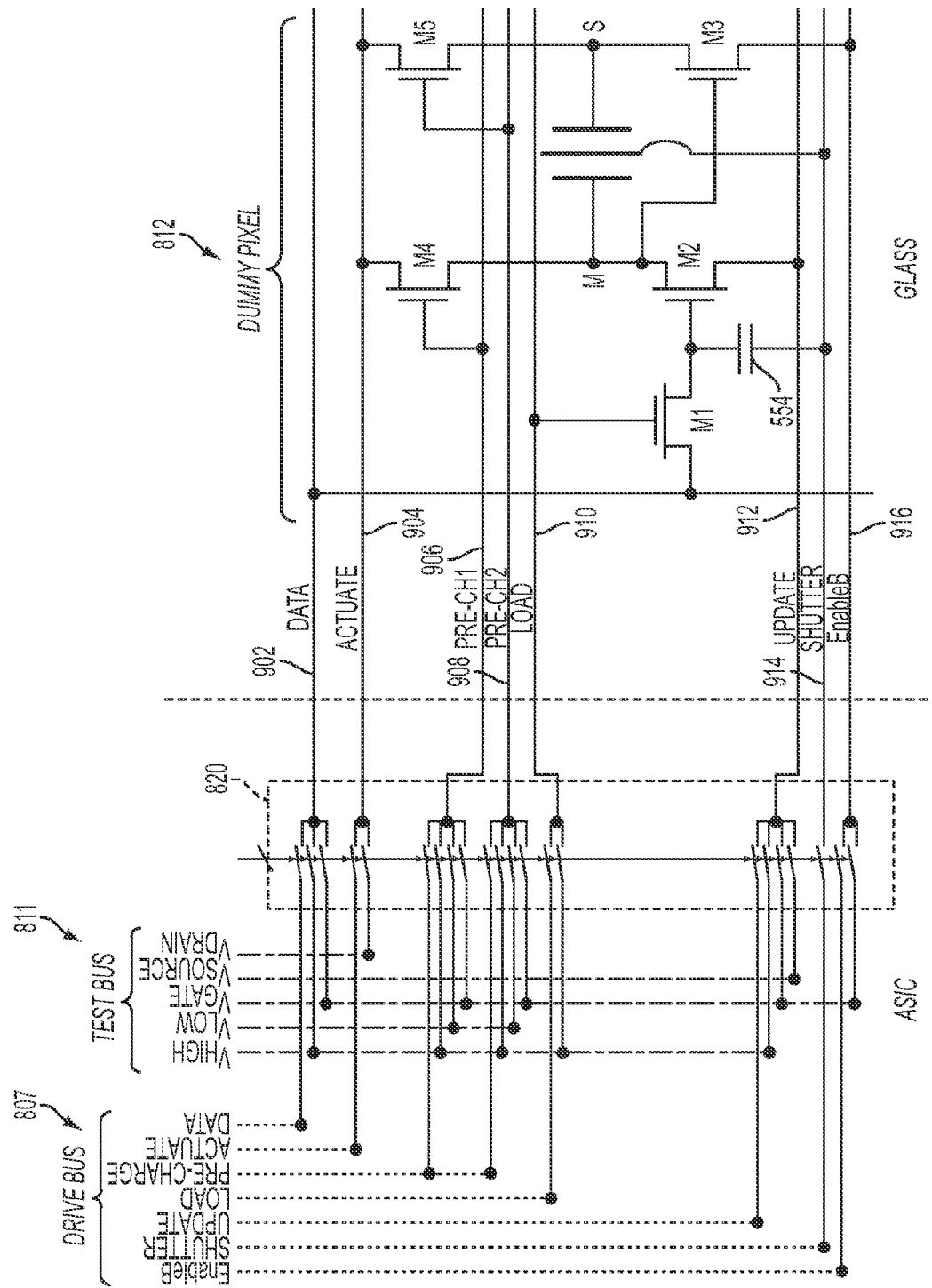
FIG. 7 shows an expanded view of portions of the driver chip and the dummy display element shown in FIG. 6.

FIG. 7 shows an expanded view of portions of the driver chip 806 and the dummy display element 802 shown in FIG. 6. In particular, FIG. 7 shows the drive bus 807, the test bus 811, the switches 820, and the dummy display element pixel circuit 812.

The dummy display element pixel circuit 812 includes a DATA interconnect 902, an ACTUATE interconnect 904, two PRE-CHARGE interconnects (a PRE-CH1 interconnect 906 and a PRE-CH2 interconnect 908), a LOAD interconnect 910, an UPDATE interconnect 912, a SHUTTER interconnect 914, and an ENABLEB interconnect 916.

The drive bus 807 includes interconnects via which each of the drive signals used to drive the pixel circuits 810 and 812 can be communicated to each of the display elements 802. The drive bus 807 includes a corresponding interconnect for each of the interconnects of the dummy display element pixel circuit 812, except that the drive bus 807 includes only a single pre-charge interconnect instead of two. The dummy display element pixel circuit 812 includes two pre-charge interconnects so that they can be independently switched to different interconnects in the test bus 811 when the dummy display element 802 is under test.

When the dummy display element pixel circuit 812 is not under test, each of the dummy display element pixel circuit 812 interconnects is switched by the switches 820 to corresponding drive bus 807 interconnects. Both of the pre-charge interconnects of the dummy display element pixel circuit 812, PRE-CH1 906 and PRE-CH2 908, are connected to the single PRE-CHARGE interconnect in the drive bus 807. In this state, the dummy display element pixel circuit 812 experiences the same signals and loads as the other display element pixel circuits 810. As such, to the extent that the operating parameters of the TFTs in the other display element pixel circuits 810 vary over time due to use, the TFTs in dummy display element pixel circuit 812 will experience similar variations. Thus, monitoring the operating parameters of the dummy display element pixel circuit 812 TFTs can yield information that can be used to adjust the drive and controls signals applied to the pixel circuits 810 of the other display elements 802 over the lifetime of the display apparatus 800 to maintain reliable operation.

The test bus 811 includes five interconnects: a Vhigh interconnect, a Vlow interconnect, a Vsource interconnect, a Vdrain interconnect, and a Vgate interconnect. The Vhigh interconnect carries a high voltage used to fully turn on any TFTs located between a TFT under test and the driver chip 806. The Vlow interconnect carries a low voltage sufficient to keep off any TFT not in the circuit path of the TFT under test. The Vsource and Vdrain interconnects carry a voltage to be put across a TFT under test, while the Vgate interconnect is used for applying test gate voltages to the TFT under test.

When the operating parameters of the dummy display element pixel circuit 812 TFTs are to be tested, the switches 820 switch the dummy display element pixel circuit interconnects to couple to appropriate interconnects in the test bus. In general, to test a given TFT (the "TFT under test"), the interconnects in the dummy display element pixel circuit 812 are switched to interconnects such that all TFTs between the source and drain terminals of the TFT under test and the driver chip are fully on, the gate of the TFT under test is connected to the Vgate interconnect of the test bus 811, all TFTs between the gate of the TFT under test and the driver chip 806 are fully on, and all TFTs not needed to be on to achieve the above are switched off As such the switches 820 are configured to switch the DATA interconnect 902 of the dummy display element pixel circuit 812 between four possible states. In a first state, the DATA interconnect is coupled to the DATA interconnect 902 of the drive bus 807. In a second state, the DATA interconnect 902 is coupled to the Vhigh interconnect of the test bus 811. In a third state, the DATA interconnect 902 is coupled to the Vgate interconnect of the test bus. In the fourth state, the DATA interconnect 902 is disconnected from both the drive bus 807 and the test bus 811.

The ACTUATE interconnect 904 of the dummy display element pixel circuit 812 can be switched between three states by the switches 820. In a first state, the ACTUATE interconnect 904 is coupled to the ACTUATE interconnect 904 of the drive bus 807. In a second state, the ACTUATE interconnect 904 is coupled to the Vdrain interconnect of the test bus 811. In a third state, the ACTUATE interconnect 904 is disconnected from both the drive bus 807 and the test bus 811.

The PRE-CH1 and PRE-CH2 interconnects 906 and 908 can each be independently switched by the switches 820 between five possible states. They can either be coupled to the PRE-CHARGE interconnect of the drive bus 807, or the Vhigh, Vlow, or Vgate interconnects of the test bus 811. In addition, both of the PRE-CH1 and PRE-CH2 interconnects 906 and 908 of the dummy display element pixel circuit 812 can be disconnected from both the drive bus 807 and the test bus 811.

The LOAD interconnect 910 of the dummy display element pixel circuit 812 can be switched by the switches 820 between being connected to the LOAD interconnect 910 of the drive bus 807 and the Vhigh interconnect of the test bus 811. In addition, the LOAD interconnect 910 of the dummy display element pixel circuit 812 can be disconnected from both the drive bus 807 and the test bus 811.

The UPDATE interconnect 912 of the dummy display element pixel circuit 812 can be switched by the switches 820 between being connected to the UPDATE 912 interconnect of the drive bus and the Vhigh, Vgate, and Vsource interconnects of the test bus 811. In addition, the UPDATE interconnect 912 of the dummy display element pixel circuit 812 can be disconnected from both the drive bus 807 and the test bus 811. The SHUTTER interconnect 914 of the dummy display element pixel circuit can be switched by the switches 820 between being connected to the SHUTTER interconnect 914 of the drive bus the Vlow interconnect of the test bus 811, or being disconnected from both the drive bus 807 and the test bus 811.

The EnableB interconnect 916 of the dummy display element pixel circuit 812 can be switched by the switches 820 between being connected to the EnableB interconnect 916 of the drive bus 807 and the Vgate interconnect of the test bus 811. In addition, the EnableB interconnect 916 of the dummy display element pixel circuit 812 can be disconnected from both the drive bus 807 and the test bus 811.

The dummy display element pixel circuit 812 includes five TFTs M1-M5. Each of the TFTs M1-M5 corresponds to one of the TFTs included in the display element pixel circuit 500 shown in FIG. 5 and in the viewable display element pixel circuits 810. The M1 transistor corresponds to the write-enable transistor 552, the M2 transistor corresponds to the first discharge transistor 514, the M3 transistor corresponds to the second discharge transistor 524, the M4 transistor corresponds to the first charge transistor 512, and the M5 transistor corresponds to the second charge transistor 522.

Figure 8A:
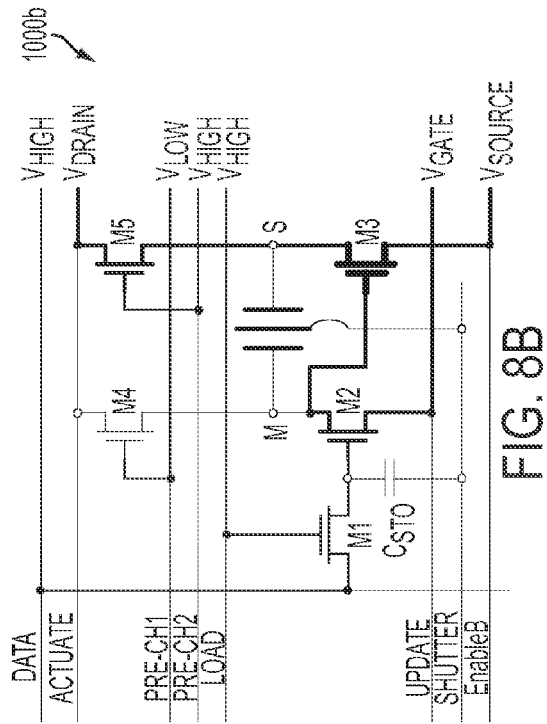
FIGS. 8A-8E show example circuit diagrams resulting from the various configurations of the switches shown in FIG. 7 used to test each of the five TFTs of a dummy display element pixel circuit.
Figure 8B:
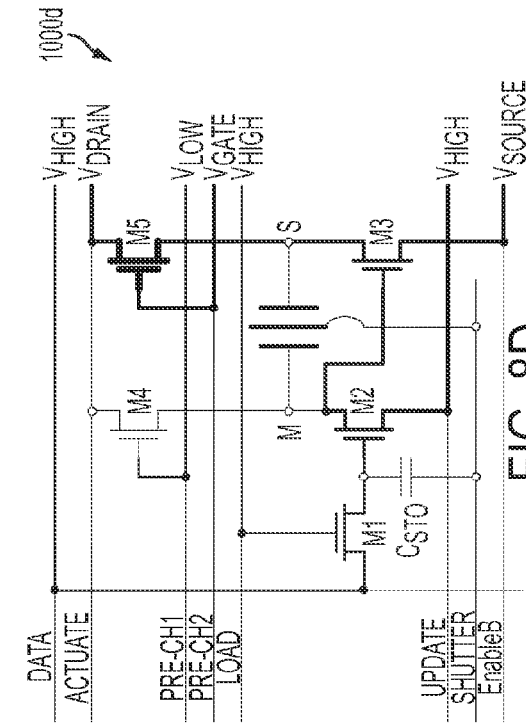
Figure 8C:
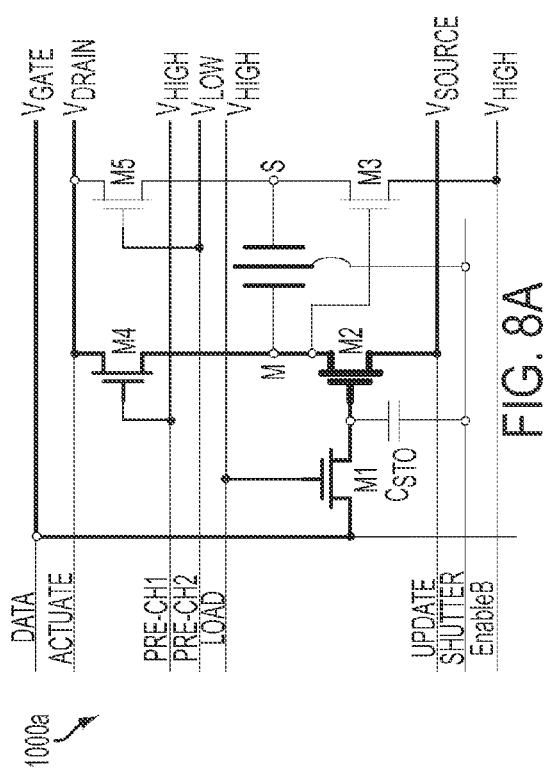
Figure 8D:
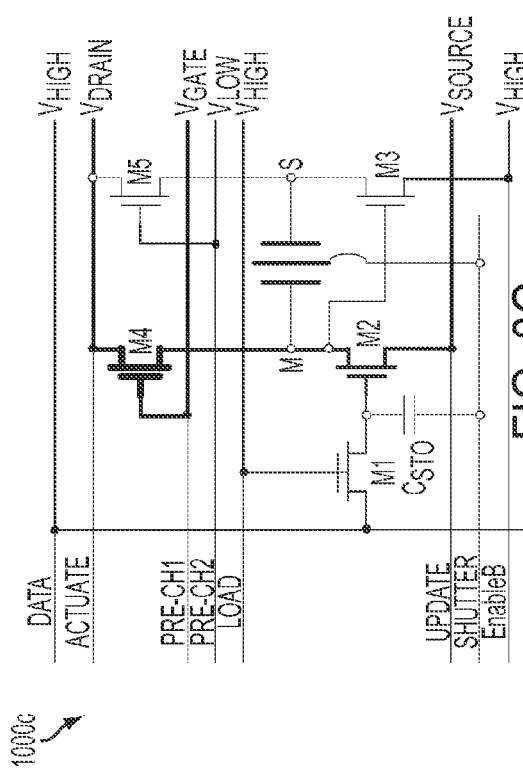
Figure 8E:
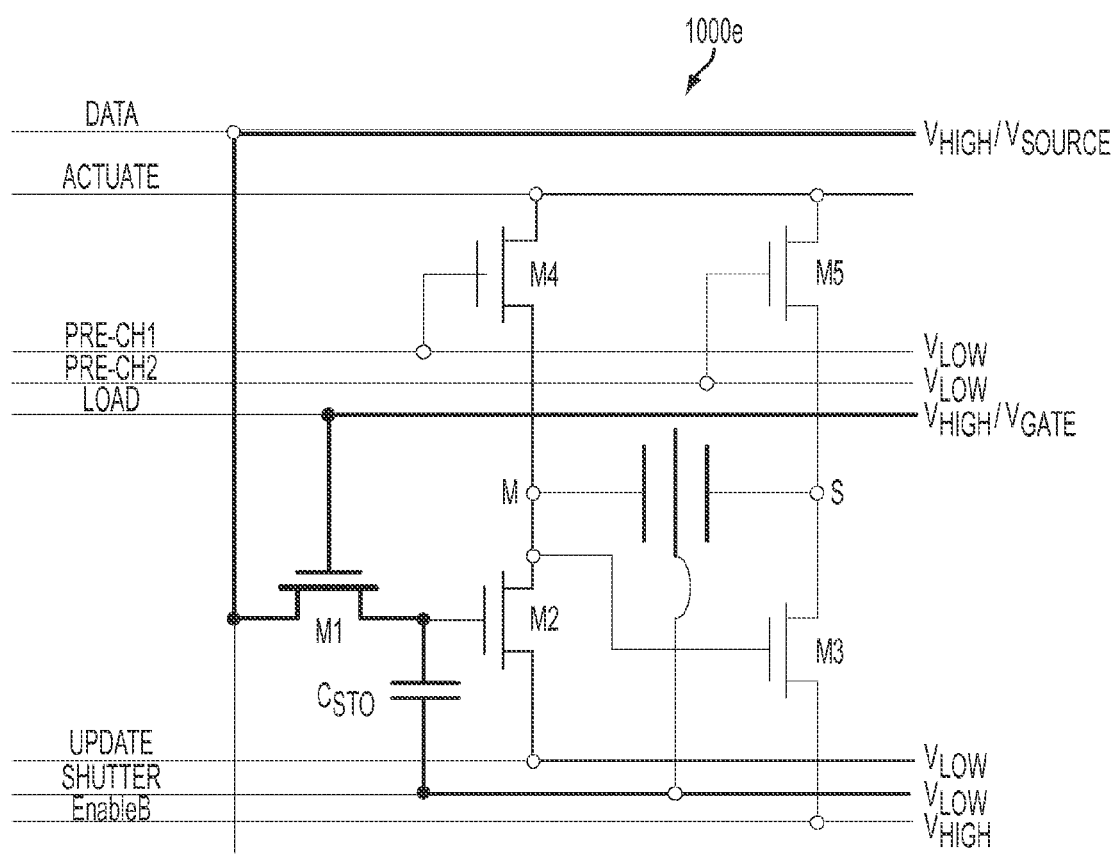

FIGS. 8A-8E show example circuit diagrams 1000a-1000e resulting from the various configurations of the switches 820 shown in FIG. 7 used to test each of the five TFTs M1-M5 of a dummy display element pixel circuit. FIG. 8A shows a circuit diagram 1000a used in the testing of the transistor M2. FIG. 8B shows a circuit diagram 1000b used in the testing of the transistor M3. FIG. 8C shows a circuit diagram 1000c used in the testing of the transistor M4. FIG. 8D shows a circuit diagram 1000d used in the testing of the transistor M5. FIG. 8E shows a circuit diagram 1000e used in the testing of the transistor M1. In each of the circuit diagrams 1000a-1000e, interconnects are shown in three different ways. Interconnects with the heaviest weight correspond to interconnects that are directly involved in the measurement of the operating parameters of the TFT under test, forming what are referred to herein as "measurement circuits". Interconnects having an intermediate weight correspond to interconnects that carry bias voltages used to, e.g., turn on TFTs other than the TFT under test to help form the measurement circuits. Interconnects of the least weight correspond to interconnects that are not substantially involved in the measurement of the operating parameters of the TFT under test.

As indicated above, FIG. 8A shows a circuit diagram 1000a used in the testing of the transistor M2. In the order to form the measurement circuits used to test the M2 transistor, the M1 and M4 transistors are turned on, such that a path exists between the source/drain terminals of the M2 transistor and the Vsource and Vdrain interconnects of the test bus 811 and between the gate of the M2 transistor and the Vgate interconnect of the test bus 811 via the M1 transistor and the DATA interconnect of the dummy display element display element circuit 812. At the same time, the M3 and M5 transistors are kept off to prevent alternative current paths through the dummy display element pixel circuit 812. To turn the M1 and M4 transistors on, the LOAD and PRE-CH1 interconnects of the dummy display element pixel circuit 812 are connected by the switches 820 to the Vhigh interconnect of the test bus 811. To keep the M5 transistor off, the PRE-CH2 interconnect of the dummy display element pixel circuit is connected by the switches 820 to the Vlow interconnect of the test bus 811. To keep the M3 transistor off, the EnableB interconnect 916 of the dummy display element pixel circuit 812 is connected by the switches 820 to the Vhigh interconnect of the test bus. The source and drain terminals of the M2 transistor are coupled to the Vsource and Vdrain interconnects of the test bus by connecting the Vsource and Vdrain test bus 811 interconnects to the UPDATE and ACTUATE interconnects 912 and 904 of the dummy display element pixel circuit 812, respectively.

FIG. 8B shows a circuit diagram 1000*b* used in the testing of the transistor M3. In the order to form the measurement circuits used to test the M3 transistor, the M5, M1, and M2 transistors are turned on, such that a path exists between the source/drain terminals of the M3 transistor and the Vsource and Vdrain interconnects of the test bus 811 and between the gate of the M3 transistor and the Vgate interconnect of the test bus 811. The M2 transistor forms the path between the gate of the M3 transistor and the Vgate interconnect via the UPDATE interconnect 912 of the dummy display element pixel circuit 812. The M1 transistor is turned on for the purposes of allowing the M2 transistor to be turned on. At the same time, the M4 transistor is kept off to prevent alternative current paths through the dummy display element pixel circuit 812. To turn the M1, M2, and M5 transistors on, the LOAD, DATA, and PRE-CH2 interconnects 910, 902, and 908 of the dummy display element pixel circuit 812 are connected by the switches 820 to the Vhigh interconnect of the test bus 811. To keep the M4 transistor off, the PRE-CH1 interconnect 906 of the dummy display element pixel circuit 812 is connected by the switches 820 to the Vlow interconnect of the test bus 811. The source and drain terminals of the M3 transistor are coupled to the Vsource and Vdrain interconnects of the test bus 811 by connecting the Vsource and Vdrain test bus interconnects to the EnableB and ACTUATE interconnects 916 and 904 of the dummy display element pixel circuit 812, respectively.

FIG. 8C shows a circuit diagram 1000*c* used in the testing of the transistor M4. In the order to form the measurement circuits used to test the M4 transistor, the M1 and M2 transistors are turned on, such that a path exists between the source/drain terminals of the M4 transistor and the Vsource and Vdrain interconnects of the test bus 811 and between the gate of the M4 transistor and the Vgate interconnect of the test bus 811 via the PRE-CH1 interconnect of the dummy display element pixel circuit. The M2 transistor forms the path between source terminal of the M4 transistor and the Vsource interconnect of the test bus, and the M1 transistor is turned on for the purposes of allowing the M2 transistor to be turned on. At the same time, the M3 and M5 transistors are kept off to prevent alternative current paths through the dummy display element pixel circuit 812. To turn the M1 and M2 transistors on, the LOAD and DATA interconnects 910 and 902 of the dummy display element pixel circuit are connected by the switches 820 to the Vhigh interconnect of the test bus 811. To keep the M5 transistor off, the PRE-CH2 interconnect 908 of the dummy display element pixel circuit is connected by the switches 820 to the Vlow interconnect of the test bus 811. To keep the M3 transistor off, the EnableB interconnect 916 of the dummy display element pixel circuit 812 is connected by the switches 820 to the Vhigh interconnect of the test bus. The source and drain terminals of the M4 transistor are coupled to the Vsource and Vdrain interconnects of the test bus by connecting the Vsource test bus 811 interconnect to UPDATE interconnect 916 and by connecting the Vdrain interconnect to the ACTUATE interconnect 904.

FIG. 8D shows a circuit diagram 1000*d* used in the testing of the transistor M5. In the order to form the measurement circuits used to test the M5 transistor, the M1, M2, and M3 transistors are turned on, such that a path exists between the source/drain terminals of the M5 transistor and the Vsource and Vdrain interconnects of the test bus 811 and between the gate of the M5 transistor and the Vgate interconnect of the test bus via the PRE-CH2 interconnect 908 of the dummy display element pixel circuit. The M3 transistor forms the path between source terminal of the M5 transistor and the Vsource interconnect of the test bus 811, and the M1 and M2 transistors are turned on for the purposes of allowing the M3 transistor to be turned on. At the same time, the M4 transistor is kept off to prevent alternative current paths through the dummy display element pixel circuit 812. To turn the M1, M2, and M3 transistors on, the LOAD, DATA, and UPDATE interconnects 910, 902, and 912 of the dummy display element pixel circuit 812 are connected by the switches 820 to the Vhigh interconnect of the test bus 811. To keep the M4 transistor off, the PRE-CH1 interconnect 906 of the dummy display element pixel circuit 812 is connected by the switches 820 to the Vlow interconnect of the test bus. The source and drain terminals of the M5 transistor are coupled to the Vsource and Vdrain interconnects of the test bus by connecting the Vsource test bus interconnect to the EnableB interconnect 916 and by connecting the Vdrain interconnect to the ACTUATE interconnect 904.

FIG. 8E shows a circuit diagram 1000*e* used in the testing of the M1 transistor. The M1 transistor is tested in a different fashion than the remaining transistors M2-M5 and will be discussed further below. That being said, to form the appropriate measurement circuit for testing the M1 transistor, all of the other transistors M2-M5 are turned off. To that end, each of the ACTUATE, PRE-CH1, PRE-CH2, UPDATE, and EnableB interconnects 904, 906, 908, 912, and 916 of the dummy display element pixel circuit 812 are coupled to the Vlow interconnect of the test bus 811. The SHUTTER interconnect 914 is also coupled to Vlow such that the terminal of the storage capacitor is coupled to a low voltage. The LOAD interconnect 910 is cycled between being connected to Vhigh and Vgate while the DATA interconnect 902 is cycled through being connected to Vhigh and Vdrain, as described further below, to test the operating parameters of the M1 transistor.

Figure 9:
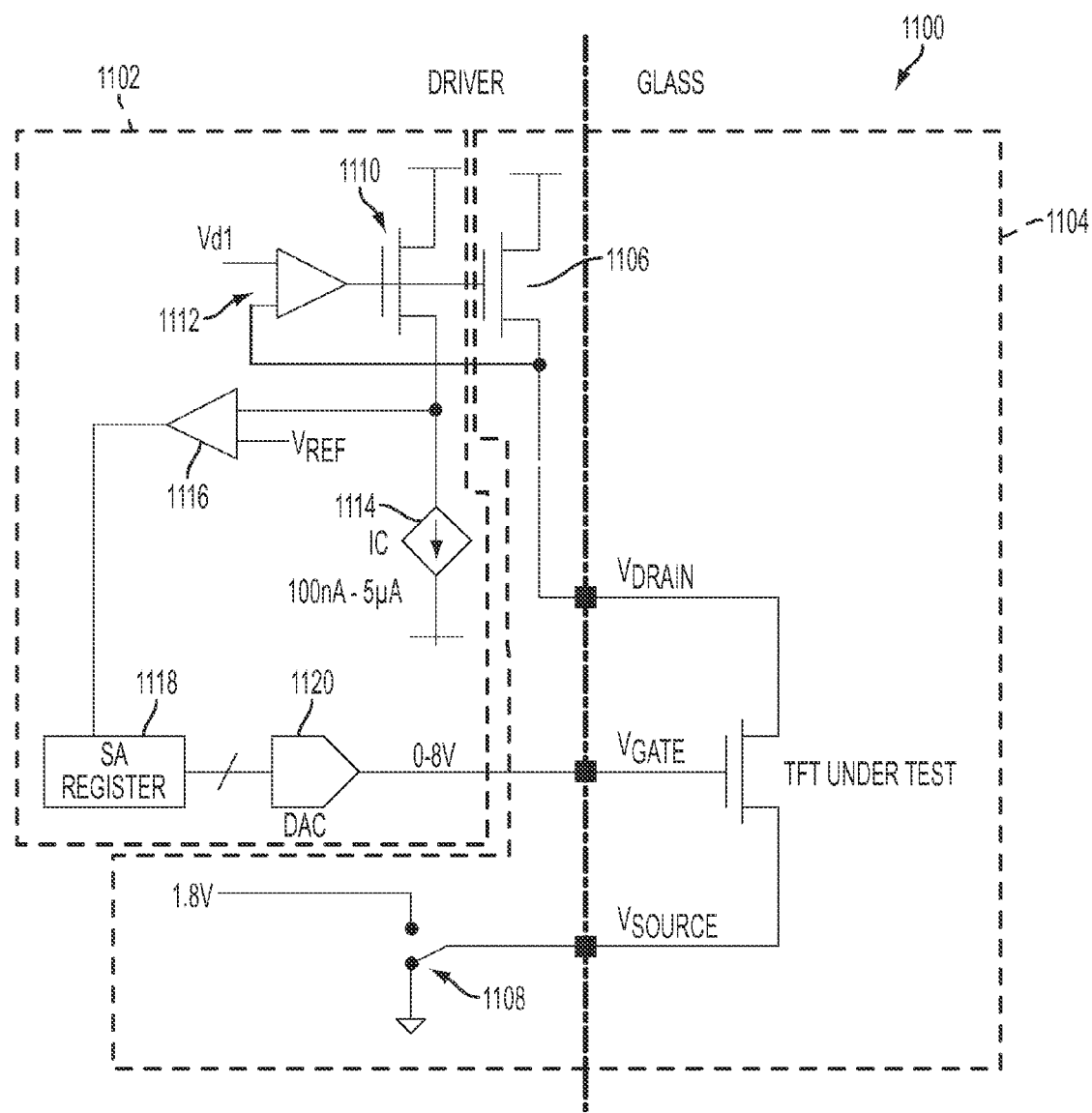
FIG. 9 shows an example TFT evaluation circuit.

FIG. 9 shows an example TFT evaluation circuit 1100. The TFT evaluation circuit 1100 can be coupled, for example, to the test bus 811 shown in FIG. 6, within the driver chip 806 shown in FIGS. 6 and 7. The TFT evaluation circuit 1100 includes a measurement portion 1102 and a test portion 1104.

The test portion 1104 of the TFT evaluation circuit 1100 includes a test source follower transistor 1106 between a voltage rail and the TFT under test (via the Vdrain interconnect of the test bus 811 shown in FIG. 7). The test portion 1104 also includes a source terminal voltage switch 1108 for connecting the source terminal of the TFT under test to either a ground voltage or to a positive voltage if the TFT under test has a negative voltage threshold. For the remainder of this discussion, it will be assumed that the TFT under test has a positive voltage threshold and the source terminal voltage switch 1108 couples the source terminal of the TFT under test to ground via the Vsource terminal of the test bus 811.

The measurement portion 1102 of the TFT evaluation circuit 1100 includes a measurement source follower transistor 1110, a negative feedback amplifier 1112, a current source 1114, a comparator 1116, a successive approximation register (SAR) 1118, and a digital to analog converter (DAC) 1120. The measurement source 1114 follower transistor 1110 couples the current source 1114 to the same voltage rail as is coupled to the test source follower transistor 1106. The gates of the both the test source follower transistor 1106 and the measurement source follower transistor 1110 are coupled to the output of the negative feedback amplifier 1112. The negative feedback amplifier 1112 has as inputs an interconnect coupled to the Vdrain interconnect of the test bus 811 and a reference voltage Vd1. The comparator 1116 has as inputs an interconnect coupled to the source of the measurement source follower transistor 1110 and a second reference voltage Vref, which in some implementations is configured to be substantially equal to Vd1. The output of the comparator 1116 is input to the SAR 1118. The SAR 1118, in turn, is coupled to the DAC 1120, which outputs a gate voltage $V_G$ to the TFT under test over the VGate interconnect of the test bus 811. The SAR 1118 is configured to, depending on its input, output voltages that successively increase or decrease a bit value in the DAC 1120 by 1.

The TFT evaluation circuit 1100, in some implementations, is operated as follows. At start-up of the display apparatus, a constant voltage $V_{SFi}$ is applied to the gate of test source follower transistor 1106 and an initial value for the gate voltage $V_{G0}$ for the TFT under test is loaded into the DAC 1120. In some implementations, $V_{G0}$ is selected to be at the middle of the range of available values in the DAC. For example, for an 8-bit DAC, $V_{G0}$ would be selected to be a voltage corresponding to 10000000 or 01111111. This results in the DAC 1120 applying $V_{G0}$ to the gate terminal of the TFT under test via the Vgate interconnect of the test bus and an initial current through the test source follower transistor 1106, the TFT under test, and the measurement source follower transistor 1110, while the negative feedback amplifier 1112 keeps the voltage on the drain of the TFT under test ($V_D$) constant at Vd1.

Based on the level of current passing the measurement source follower transistor 1110 in comparison to the configured output of the current source 1114, the comparator 1116 outputs a voltage to SAR 1118. If the current through the measurement source follower transistor 1110 is lower than the configured output of the current source 1114, comparator 1116 outputs an appropriate logic level, which in turn, causes the SAR 1118 to output a higher voltage to the DAC. The process continues until a steady state is reached or until $V_G$ has been adjusted a number of times equal to the number of bits of the resolution of the DAC 1120.

After a test at a first current source 1114 output level/reference voltage level (Vd.) pair has completed, in some implementations, one or more additional tests are conducted with different current source 1114 output levels and/or different reference voltage (Vd1) levels. The final values stored in the DAC 1120 at the end of each test is communicated to a display controller (such as the controller 134 shown in FIG. 1B) for use by the controller in determining adjustments to circuit drive signals.

Figure 10:
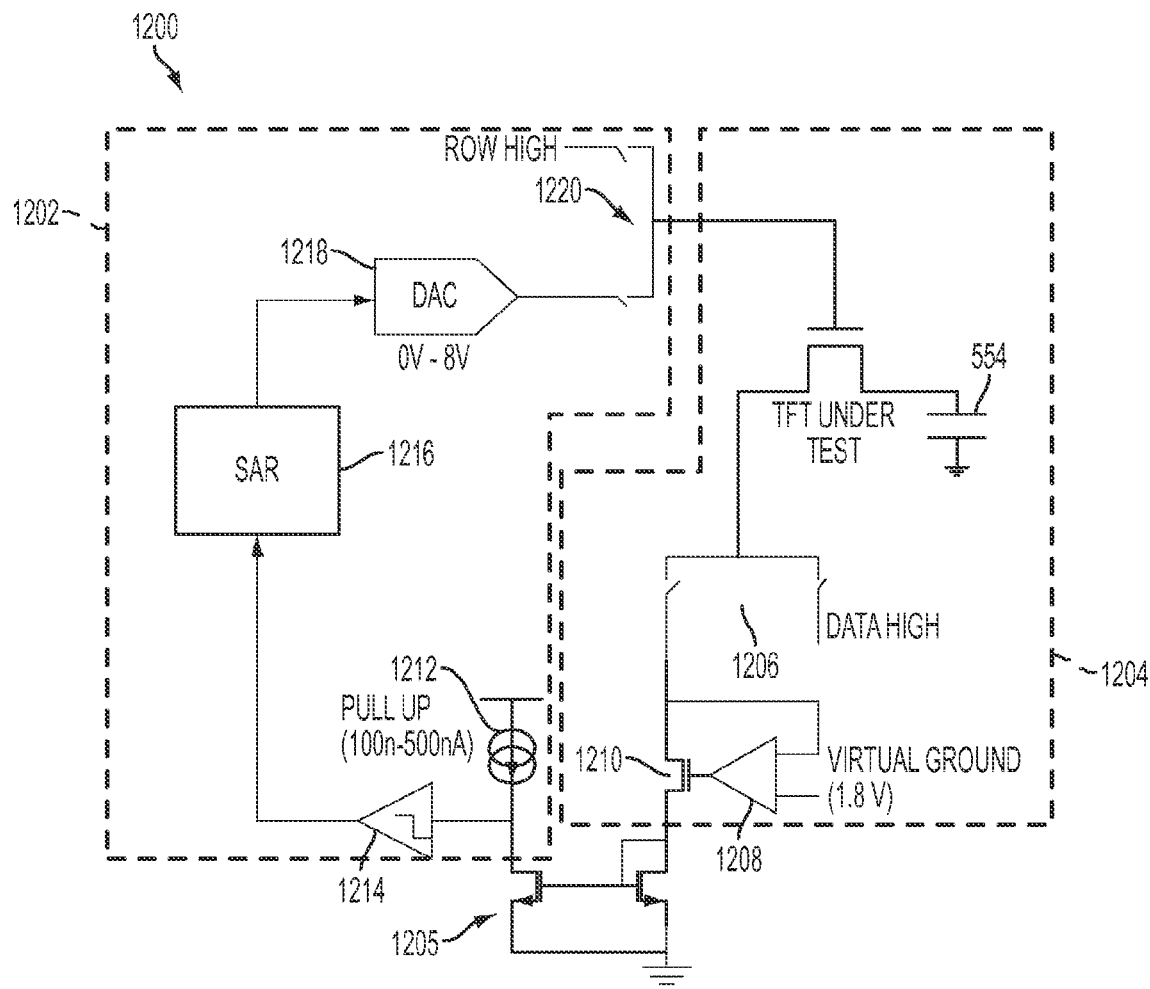
FIG. 10 shows an example measurement circuit for measuring the operating parameters of the M1 transistor using the measurement circuit shown in FIG. 8E.

FIG. 10 shows an example measurement circuit 1200 for measuring the operating parameters of the M1 transistor using the measurement circuit 1000e shown in FIG. 8E. The measurement circuit 1200 includes a measurement portion 1202 and a test portion 1204 coupled by a current mirror 1205. The test portion 1204 includes a first priming switch 1206, an error amplifier 1208, and a test source follower transistor 1210. The measurement portion 1202 includes a current source 1212, a voltage comparator 1214, a successive approximation register (SAR) 1216, a digital to analog converter (DAC) 1218, and a second priming switch 1220.

In operation, the measurement circuit 1200 cycles back and forth between a priming stage and a test stage. In the priming stage, the first priming switch 1206 couples the DATA interconnect of the dummy display element pixel circuit 812 (shown in FIG. 6) to the Vhigh interconnect of the test bus 811 (shown in FIG. 7). At the same time, the second priming switch 1220 couples the LOAD interconnect of the dummy display element pixel circuit 812 to the Vhigh interconnect of the test bus 811. As a result, a voltage is stored on the data store capacitor 554 of the dummy display element pixel circuit 812.

After a voltage is stored on the data store capacitor 554, the measurement circuit 1200 switches into a test phase. In the test phase, the first priming switch decouples the DATA interconnect of the dummy display element pixel circuit 812 from the Vhigh interconnect of the test bus 811 and couples it to the source of the test source follower transistor 1210 and to an input of the error amplifier 1208 via the Vsource interconnect of the test bus 811. The other input of the error amplifier 1208 is coupled to a constant offset voltage (e.g., 1.8V).

The second priming switch 1220 decouples the LOAD interconnect of the of the dummy display element pixel circuit 812 from the Vhigh interconnect of the test bus 811 and connects it to the output of the DAC 1218, applying the output voltage of the DAC to the gate of the M1 transistor. If the voltage corresponding to the value stored in the DAC is sufficiently high, the M1 transistor turns on, allowing current to flow from the data store capacitor 554 through the M1 transistor and through the test source follower transistor 1210.

The current mirror 1205 mirrors this current through a portion of the measurement portion 1202 of the measurement circuit 1200. The voltage comparator 1214 outputs a voltage that is based on a comparison between the mirrored current and the configured current output of the current source 1212. The voltage output by the voltage comparator 1214 is input to the SAR 1216, which either increments the value stored in the DAC 1218 if the mirrored current is 0 or too low, or reduces the stored value by one bit if the mirrored current is too high.

After a new value is stored in the DAC 1218, the priming switches 1206 and 1220 reset to their priming stage states such that a new voltage can be stored on the data store capacitor 554. In some implementations, the data store capacitor 554 has a relatively low capacitance (e.g., on the order of several hundred femto-farads), and thus has to be repeatedly recharged to ensure its voltage is sufficient to cause a detectable current through M1 were a high enough voltage applied to the gate of M1.

In some implementations, the initial value input to the DAC is a value representing the middle of the DACs range. For example, for an 8-bit DAC, the initial value could be 01111111 or 10000000. In some such implementations, a final measurement can be detected by a number of cycles of the measurement circuit equal to the number of bits of resolution of the DAC 1218 (e.g., eight cycles for an 8-bit DAC).

In some implementations, the measurement circuit 1200 is configured to detect very small currents through the M1 transistor, thereby allowing it to measure the threshold value of the M1 transistor (i.e., the lowest gate voltage at which a current is seen flowing through the M1 transistor). In some implementations, after a first measurement of the M1 threshold voltage is determined using a first current source 1212 output level, the output level of the current source 1212 is changed and the test is repeated to take additional measurements. The resulting measurements can be transmitted back to a display controller, such as the controller 134 shown in FIG. 1B to adjust gate voltages applied to the M1 transistor of remaining pixel circuits 812.

Figure 11A:
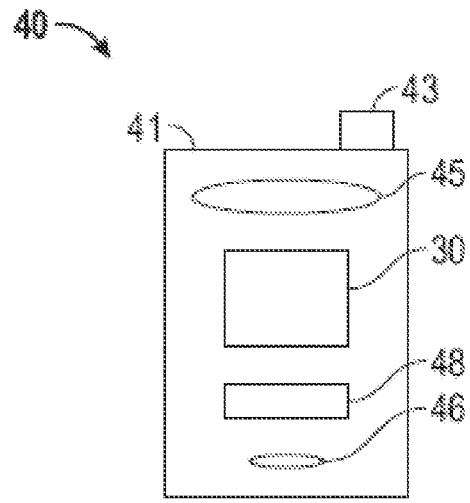
FIGS. 11A and 11B show system block diagrams of an example display device that includes a plurality of display elements.
Figure 11B:
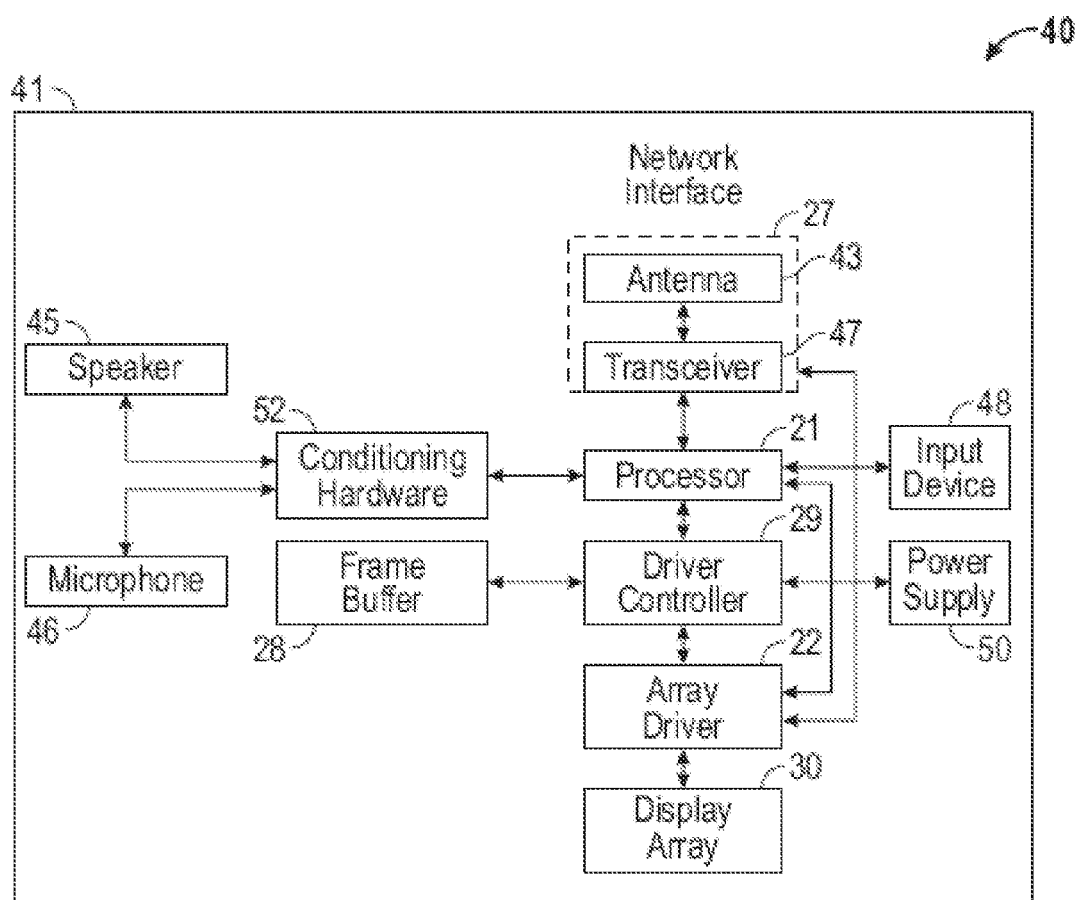

FIGS. 11A and 11B show system block diagrams of an example display device 40 that includes a plurality of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) display, LCD, or thin-film transistor (TFT) LCD, or a non-flat-panel display, such as a cathode ray tube (CRT) or other tube device. In addition, the display 30 can include a mechanical light modulator-based display, as described herein.

The components of the display device 40 are schematically illustrated in FIG. 11B. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 11A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11 a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements. In some implementations, the array driver 22 and the display array 30 are a part of a display module. In some implementations, the driver controller 29, the array driver 22, and the display array 30 are a part of the display module.

In some implementations, the driver controller 29, the array driver 22, and the display array 30 are appropriate for any of the types of displays described herein. For example, the driver controller 29 can be a conventional display controller or a bi-stable display controller (such as a mechanical light modulator display element controller). Additionally, the array driver 22 can be a conventional driver or a bi-stable display driver (such as a mechanical light modulator display element controller). Moreover, the display array 30 can be a conventional display array or a bi-stable display array (such as a display including an array of mechanical light modulator display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
an array of image forming display elements arranged across a viewing region of a display, each of the image forming display elements having an associated image forming display element pixel circuit capable of controlling the state of its respective image forming display element;
a dummy display element positioned outside of the viewing region, the dummy display element having a dummy display element pixel circuit that is substantially similar to each of the image forming display element pixel circuits, the dummy display element pixel circuit capable of controlling the state of the dummy display element and to allow the testing of a plurality of thin-film transistors (TFTs) included in the dummy display element pixel circuit;
a drive bus capable of outputting drive and control signals to the image forming display elements and to the dummy display element;
a test bus capable of outputting test signals to the dummy display element pixel circuit; and
a set of switches capable of:
in a first switch configuration, connecting interconnects within the dummy display element pixel circuit to interconnects within the drive bus to expose the dummy display element pixel circuit to loads experienced by the image forming display element pixel circuits;
in a second switch configuration, connecting interconnects within the dummy display element pixel circuit to interconnects within the test bus to measure one or more operating parameters of a first TFT of the plurality of TFTs in the dummy display element pixel circuit; and
in a third switch configuration, connecting interconnects within the dummy display element pixel circuit to interconnects within the test bus to measure one or more operating parameters of a second TFT of the plurality of TFTs in the dummy display element pixel circuit.

2. The apparatus of claim 1, wherein the set of switches is capable of coupling the dummy display element pixel circuit interconnects to interconnects in the test bus in a plurality of additional configurations for testing each of a remainder of the plurality of TFTs in the dummy display element pixel circuit.

3. The apparatus of claim 2, wherein the switches are capable of turning on all TFTs in the dummy display element pixel circuit between the gate terminal of a TFT under test and the test bus.

4. The apparatus of claim 2, wherein the switches are capable of turning on all TFTs in the dummy display element pixel circuit between the source and gate terminals of a TFT under test and the test bus.

5. The apparatus of claim 2, further comprising a TFT evaluation circuit capable of determining a threshold voltage of a TFT under test in the dummy display element pixel circuit, and the one or more measured operating parameters includes the threshold voltage.

6. The apparatus of claim 2, further comprising a TFT evaluation circuit capable of determining a gate voltage to be applied to a TFT under test sufficient to cause a configured current level through the TFT under test.

7. The apparatus of claim 2, further comprising a successive approximation register coupled to a digital to analog converter, wherein an output of the digital to analog converter is coupled to a Vgate interconnect of the test bus and the successive approximation register and the digital to analog converter are capable of applying a set of incrementally adjusted voltages to a gate terminal of a TFT under test via the Vgate interconnect.

8. The apparatus of claim 1, further comprising:
a display including an array of image forming display elements and the dummy display element,
a processor that is capable of communicating with the display, the processor being capable of processing image data; and
a memory device that is capable of communicating with the processor.

9. The apparatus of claim 8, the display further including:
a driver circuit capable of sending at least one signal to the display; and
a controller capable of sending at least a portion of the image data to the driver circuit.

10. The apparatus of claim 8, further including:
an image source module capable of sending the image data to the processor, wherein the image source module comprises at least one of a receiver, transceiver, and transmitter.

11. The apparatus of claim 8, the display device further including:
an input device capable of receiving input data and to communicate the input data to the processor.

12. An apparatus, comprising:
an array of image forming display elements arranged across a viewing region of a display, each of the image forming display elements having an associated image forming display element pixel circuit capable of controlling the state of its respective image forming display element;
a dummy display element positioned outside of the viewing region, the dummy display element having a dummy display element pixel circuit that is substantially similar to each of the image forming display element pixel circuits, the dummy display element pixel circuit capable of controlling the state of the dummy display element and to allow the testing of a plurality of thin-film transistors (TFTs) included in the dummy display element pixel circuit;
a drive signal communication means for outputting drive and control signals to the image forming display elements and to the dummy display element;
a test signal communication means for outputting test signals to the dummy display element pixel circuit; and
switching means for selectively interconnecting portions of the dummy display element pixel circuit to portions of the drive signal communications means and the test signal communications means in a plurality of configurations, wherein:
in a first configuration, the switching means connects portions of the dummy display element pixel circuit to portions of the drive signal communication means to expose the dummy display element pixel circuit to loads experienced by the image forming display element pixel circuits;
in a second configuration, the switching means connects portions of the dummy display element pixel circuit to portions of the test signal communication means to measure one or more operating parameters of a first TFT of the plurality of TFTs in the dummy display element pixel circuit; and in a third switch configuration, the switching means connects portions of the dummy display element pixel circuit to portions of the test signal communication means to measure one or more operating parameters of a second TFT of the plurality of TFTs in the dummy display element pixel circuit.

13. The apparatus of claim 12, wherein the switching means is capable of connecting portions of the test signal communications means to portions of the dummy display element pixel circuit in a sufficient number of configurations to test each of a remainder of the plurality of TFTs in the dummy display element pixel circuit.

14. The apparatus of claim 13, wherein the switching means are capable of isolating a TFT under test for testing.

15. The apparatus of claim 12, further comprising a TFT evaluation means for evaluating operational parameters of a TFT under test in the dummy display element pixel circuit.

16. The apparatus of claim 15, wherein the TFT evaluation means is capable of determining a threshold voltage of the TFT under test.

17. The apparatus of claim 15, wherein the TFT evaluation means is capable of determining a gate voltage to be applied to the TFT under test sufficient to cause a configured current level through the TFT under test.

18. A method of testing a display comprising:

displaying a plurality of images on a display apparatus by applying a set of drive signals to a plurality of display element pixel circuits via a first signal bus;

applying, via the first signal bus, a subset of the drive signals used to display the plurality of images to a dummy display element pixel circuit that is substantially the same as the display element pixel circuits;

operating a set of switches to decouple the dummy display element pixel circuit from the first signal bus and to couple the dummy display element pixel circuit to a second signal bus in a first connection configuration;

applying a first set of test signals to portions of the dummy display element pixel circuit via the second signal bus with the first connection configuration to test an operating parameter of a first thin film transistor (TFT) of a plurality of TFTs included in the dummy display element pixel circuit; operating the set of switches to connect portions of the dummy display element pixel circuit to the second signal bus in a second connection configuration; and applying a second set of test signals to portions of the dummy display element pixel circuit via the second signal bus with the second connection configuration to test an operating parameter of a second TFT of the dummy display element pixel circuit.

19. The method of claim 18, further comprising operating the set of switches and applying additional sets of test signals to test an operational parameter of each of a remainder of TFTs in the dummy display element pixel circuit.

20. The method of claim 18, wherein testing an operating parameter of the first and second TFTs includes determining a threshold voltage of each of the respective TFTs.

* * * * *